US012622321B2

(12) United States Patent
Lee et al.

(10) Patent No.: US 12,622,321 B2
(45) Date of Patent: May 5, 2026

(54) SEMICONDUCTOR DEVICE INCLUDING THROUGH-SILICON VIA (TSV) TEST DEVICE AND OPERATING METHOD THEREOF

(71) Applicant: SAMSUNG ELECTRONICS CO., LTD., Suwon-si (KR)

(72) Inventors: Youngkwang Lee, Seoul (KP); Sungho Kang, Seoul (KR)

(73) Assignees: Samsung Electronics Co., Ltd., Suwon-Si (KR); Industry-Academic Cooperation Foundation, Yonsei University, Seoul (KR)

( * ) Notice: Subject to any disclaimer, the term of this patent is extended or adjusted under 35 U.S.C. 154(b) by 774 days.

(21) Appl. No.: 17/875,889

(22) Filed: Jul. 28, 2022

(65) Prior Publication Data

US 2023/0070785 A1     Mar. 9, 2023

(30) Foreign Application Priority Data

Sep. 3, 2021     (KR) ........................ 10-2021-0117936

(51) Int. Cl.
H01L 25/065     (2023.01)
G01R 19/165     (2006.01)
(Continued)

(52) U.S. Cl.
CPC .... H01L 25/0657 (2013.01); G01R 19/16576 (2013.01); H01L 22/34 (2013.01);
(Continued)

(58) Field of Classification Search
CPC ................. H01L 25/0657; H01L 22/34; H01L 2225/06541; H01L 2225/06596;
(Continued)

(56) References Cited

U.S. PATENT DOCUMENTS 7,977,962 B2     7/2011   Hargan et al.
8,498,831 B2     7/2013   Ide et al.
(Continued)

FOREIGN PATENT DOCUMENTS

KR     10-2013-0007119 A     1/2013
KR     10-2018-0117280 A     10/2018
KR             KR A     5/2020
   10-2020-0056639

OTHER PUBLICATIONS

Office Action in Korean Appln. No. 10-2021-0117936, mailed on Jul. 4, 2025, 14 pages (with English translation).
Notice of Allowance in Korean Appln. No. 10-2021-0117936, mailed on Feb. 16, 2026, 4 pages (with English translation).

*Primary Examiner* — Herve-Louis Y Assouman
(74) *Attorney, Agent, or Firm* — Fish & Richardson P.C.

(57)     ABSTRACT

A semiconductor system, a semiconductor device, a through-silicon via (TSV) test method, and a method of manufacturing a semiconductor device are provided. The semiconductor system includes a semiconductor device including a buffer die and first to L-th (where L is an integer greater than or equal to 2) stack dies stacked on the buffer die and communicating with the buffer die through N (where N is a positive integer) TSVs; and a TSV test device that measures each of voltages at one end and voltages at another end on the N TSVs according to a clock signal, compares each of the voltages at the one end and the voltages at the other end with a reference voltage, and determines whether each of the N TSVs has a plurality of TSV defect types according to comparison results.

13 Claims, 13 Drawing Sheets

(51) Int. Cl.
  *H01L 21/66*       (2006.01)
  *H01L 25/18*       (2023.01)

(52) U.S. Cl.
  CPC ............... *H01L 2225/06541* (2013.01); *H01L 2225/06596* (2013.01)

(58) Field of Classification Search
  CPC ... H01L 25/18; H01L 22/14; G01R 19/16576; G01R 31/2853; G01R 19/16566; G01R 31/2879; G01R 31/2896; G01R 31/318513; G01R 31/56
  See application file for complete search history.

(56)                 References Cited

U.S. PATENT DOCUMENTS

| | | |
|---|---|---|
| 9,013,202 B2 | 4/2015 | Chen et al. |
| 9,322,868 B2 | 4/2016 | Shin et al. |
| 9,576,934 B2 | 2/2017 | Takayangi |
| 10,401,422 B2 | 9/2019 | Kang et al. |
| 2012/0104388 A1 | 5/2012 | Choi et al. |
| 2013/0001548 A1 | 1/2013 | Jeong et al. |
| 2014/0208279 A1 | 7/2014 | Bhawmik |
| 2017/0059648 A1* | 3/2017 | Woo ................... H01L 25/0657 |
| 2020/0049767 A1* | 2/2020 | Kim ................ G01R 31/31725 |
| 2020/0096558 A1 | 3/2020 | Ide |

* cited by examiner

SEMICONDUCTOR DEVICE INCLUDING THROUGH-SILICON VIA (TSV) TEST DEVICE AND OPERATING METHOD THEREOF

CROSS-REFERENCE TO RELATED APPLICATION

A claim of priority under 35 U.S.C. § 119 is made to Korean Patent Application No. 10-2021-0117936, filed on Sep. 3, 2021, in the Korean Intellectual Property Office, the entirety of which is hereby incorporated by reference.

BACKGROUND

The present disclosure relates to through-silicon via (TSV) test devices, and more particularly to semiconductor devices including a test device for detecting TSV faults and operating methods of the semiconductor devices.

As the amount of data to be processed by electronic devices has recently increased, memory devices with high capacity and high bandwidth are required. To improve the degree of integration of semiconductor memories, three-dimensional (3D) arrangement technology in which a plurality of memory chips are stacked via a two-dimensional (2D) method have been applied. According to the demand trend for high-integration and high-capacity memory, structures that increase the capacity of memory by using a 3D arrangement structure of memory chips and that also increase the degree of integration of the memory by simultaneously reducing the size of the semiconductor chips are required. A TSV method, which is a packaging technology in which upper and lower ends of semiconductor chips are connected to through-silicon electrodes by drilling fine holes in the semiconductor chips, has been used as a 3D structure arrangement technology.

In a 3D integrated circuit, a TSV test for determining a resistively open or short-circuit defect of a TSV may be performed by measuring a voltage passing through the TSV, and calculating a resistance value of the TSV and providing data thereon.

Conventional TSV test circuits include a flip-flop and a comparator, and may detect an open and/or short-circuit defect of a TSV. However, a limited number of types of faults may be detected using conventional TSV test circuits, and the tests take a relatively long time and defect detection accuracy is low.

Accordingly, there is a need for a TSV test circuit that reduces the time for testing TSVs for faults without the need of additional hardware overhead, and that may quickly and accurately detect various types of TSV faults.

SUMMARY

Embodiments of the inventive concepts provide a semiconductor device and system including an effective silicon-through via (TSV) test device that quickly and accurately tests a TSV without hardware overhead to detect various types of TSV defects.

Embodiments of the inventive concept provide a semiconductor system including a semiconductor device including a buffer die and first to L-th stack dies stacked on the buffer die and communicating with the buffer die through N TSVs, wherein L is an integer greater than or equal to 2, and N is a positive integer; and a TSV test device that measures each of voltages at one end and voltages at another end of the N TSVs according to a clock signal, compares each of the voltages at the one end and the voltages at the another end with a reference voltage, and determines whether each of the N TSVs has a plurality of TSV defect types according to comparison results. The TSV test device further tests a first TSV included in the N TSVs for two or more different TSV defect types during one period of the clock signal.

Embodiments of the inventive concepts further provide a semiconductor device including at least two semiconductor chips electrically connected through at least one TSV; and a TSV test device arranged on at least one of the at least two semiconductor chips. The TSV test device measures at least one test voltage provided by voltage division based on a signal output through the at least one TSV, and detects whether the at least one TSV has first to third faults according to the at least one test voltage.

Embodiments of the inventive concepts still further provide a TSV test method including generating an enable signal for determining whether to connect at least one of a power supply voltage and a ground voltage to a first TSV; measuring a first test voltage or a second test voltage provided by voltage division based on a voltage applied to the first TSV according to the enable signal; comparing the first test voltage or the second test voltage with a reference voltage; and detecting whether the first TSV has a fault based on a comparison result. The detecting of whether the first TSV has a fault includes detecting whether the first TSV has a first fault corresponding to a bridge defect or a Stuck-at-1 fault; a second fault corresponding to an open defect, a resistive-open defect, or a Stuck-at-0 fault; or a third fault corresponding to a pinhole defect.

Embodiments of the inventive concepts also provide a method of manufacturing a semiconductor device including forming the semiconductor device as including a buffer die, and first to L-th stack dies stacked on the buffer die and communicating with the buffer die through N through-silicon vias (TSVs), wherein L is an integer greater than or equal to 2, and N is a positive integer; and testing the semiconductor device. The testing includes generating an enable signal for determining whether to connect at least one of a power supply voltage and a ground voltage to a first TSV from among the N TSVs; measuring a first test voltage or a second test voltage provided by voltage division based on a voltage applied to the first TSV according to the enable signal; comparing the first test voltage or the second test voltage with a reference voltage; and detecting whether the first TSV has a fault based on a comparison result. The detecting of whether the first TSV has a fault comprises detecting whether the first TSV has a first fault corresponding to a bridge defect or a Stuck-at-1 fault; a second fault corresponding to an open defect, a resistive-open defect, or a Stuck-at-0 fault; or a third fault corresponding to a pinhole defect.

BRIEF DESCRIPTION OF THE DRAWINGS

Embodiments of the inventive concepts will be more clearly understood from the following detailed description taken in conjunction with the accompanying drawings in which:

FIG. 3A illustrates a circuit diagram of a structure of a VDD control circuit according to embodiments of the inventive concepts;

FIG. 3B illustrates a circuit diagram of a structure of a GND (Ground) control circuit according to embodiments of the inventive concepts;

DETAILED DESCRIPTION OF THE EMBODIMENTS

Hereinafter, embodiments of the inventive concepts will be described in detail with reference to accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
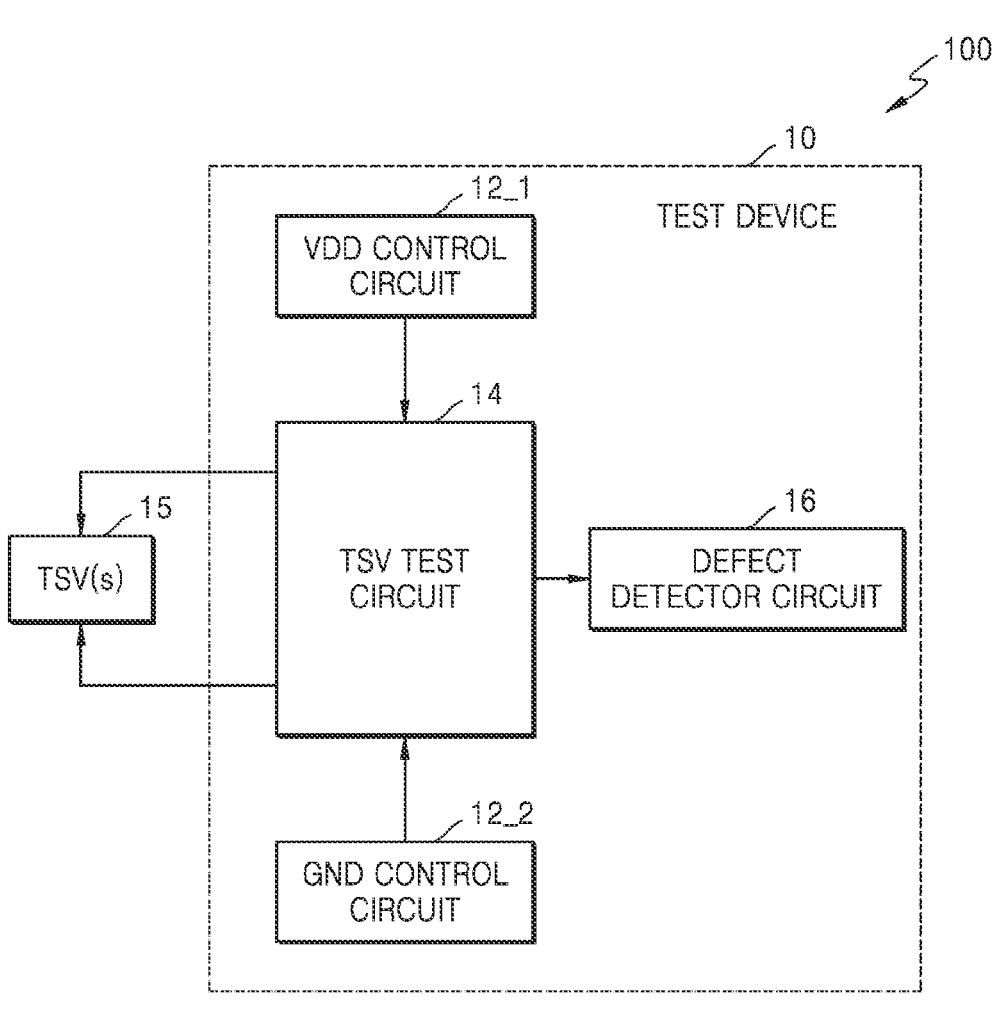
FIG. 1 illustrates a block diagram schematically showing a semiconductor device including through-silicon vias (TSV) and a TSV test device according to embodiments of the inventive concepts.

FIG. 1 illustrates a block diagram schematically showing a semiconductor device 100 including through-silicon vias (TSV) 15 and a TSV test device 10 according to embodiments of the inventive concepts.

Referring to FIG. 1, the semiconductor device 100 may include the TSVs 15 and the TSV test device 10. The TSVs 15 may be connected to the TSV test device 10, and the TSVs 15 may include N TSVs, that is, first to n-th TSVs TSV1 to TSVn (not shown). For example, the first to n-th TSVs TSV1 to TSVn may be formed of physical wires penetrating a dynamic random access memory (DRAM) die (not shown), and may be stacked and interconnected to each other by micro bumps (μbumps). The first to n-th TSVs TSV1 to TSVn may be used to connect a stack of a plurality of DRAM dies. For example, first to fourth TSVs TSV1 to TSV4 may be applied to a 4-stack high bandwidth memory (HBM). As an embodiment, the 4-stack HBM including the first to fourth TSVs TSV1 to TSV4 may be defined as a semiconductor device.

The TSV test device 10 is a device testing a fault of a TSV, and may include a VDD control circuit 12_1, a GND control circuit 12_2, a TSV test circuit 14, and a defect detector circuit 16.

The VDD control circuit 12_1 may be connected to the TSV test circuit 14, and may control a connection of a VDD voltage corresponding to a common voltage input to the TSV test circuit 14. The GND control circuit 12_2 may be connected to the TSV test circuit 14, and may control a connection of a GND voltage corresponding to a common voltage input to the TSV test circuit 14.

In some embodiments, the TSV test circuit 14 may test whether an open defect or a resistive-open defect exists in a TSV. The open defect may mean a connection of an incomplete circuit that is modeled as an infinite resistor due to a reason that the TSV is destroyed (e.g., discontinuous, deteriorated or broken) and two nodes to be connected in a circuit including the TSV are opened (e.g., disconnected from each other). The resistive-open defect may mean a connection of an incomplete circuit that is modeled as a resistor of a particular size by the resistive-opening between two nodes to be connected in a circuit including the TSV due to a reason that the TSV is destroyed (e.g., deteriorated) and a crack occurs. For example, when an arbitrary TSV has a resistive-open defect, a connection of an incomplete circuit may be modeled as a resistor having a resistance component value close to infinity between two nodes to be connected in a circuit including the arbitrary TSV.

In some embodiments, the TSV test circuit 14 may test whether a Stuck-at-0 fault or a Stuck-at-1 fault exists in an arbitrary TSV. The Stuck-at-0 fault may mean a connection of an incomplete circuit in which a line of a signal or a gate output is stuck at logic 0 regardless of an input to a circuit. The Stuck-at-1 fault may mean a connection of an incomplete circuit in which a line of a signal or a gate output is stuck at logic 1 regardless of an input to a circuit.

In some embodiments, the TSV test circuit 14 may test whether a bridge defect exists between the TSVs 15. The bridge defect may mean a connection of an incomplete circuit electrically connected between two TSVs by a resistor having a certain value. As an example, a bridge defect exists between the first and second TSVs, so that a signal of the first TSV may be transferred to the second TSV.

In some embodiments, the TSV test circuit 14 may test whether a pinhole defect exists. The pinhole defect may mean a defect in which an insulator between a TSV and a substrate is destroyed (e.g., deteriorated) and an unnecessary current path is generated.

The TSV test circuit 14 is configured to be able to separate and test the aforementioned six defects and/or faults according to time and paths, and all six defects and/or faults may be tested with high resolution. As an example, different defects and/or faults may be tested for each phase of a clock signal and thus separated in time, and different defects and/or faults may be tested for different TSVs in the same phase of the clock signal and thus spatially separated. A fault may occur due to a defect in an operation, and in some embodiments, the defect may mean a fault or an error.

The defect detector circuit 16 may be connected to the TSV test circuit 14, and may receive a divided voltage value from the TSV test circuit 14. The defect detector circuit 16 may include comparator(s), and may determine whether the aforementioned six defects and/or faults exist by comparing the received divided voltage value with a reference voltage value. For example, the reference voltage value discriminating all six faults may be set to be equal to VDD/2. Accordingly, the defect detector circuit 16 may be shared in the HBM in which a plurality of DRAM dies are stacked.

According to the TSV test device 10 and an operating method of embodiments of the inventive concepts, the TSV test device 10 may test a TSV by itself without separate external test equipment, and various types of TSV faults may be tested quickly and accurately without additional hardware overhead. Accordingly, a TSV test circuit 14 with increased test coverage and accuracy may be used to detect a TSV fault.

Figure 2:
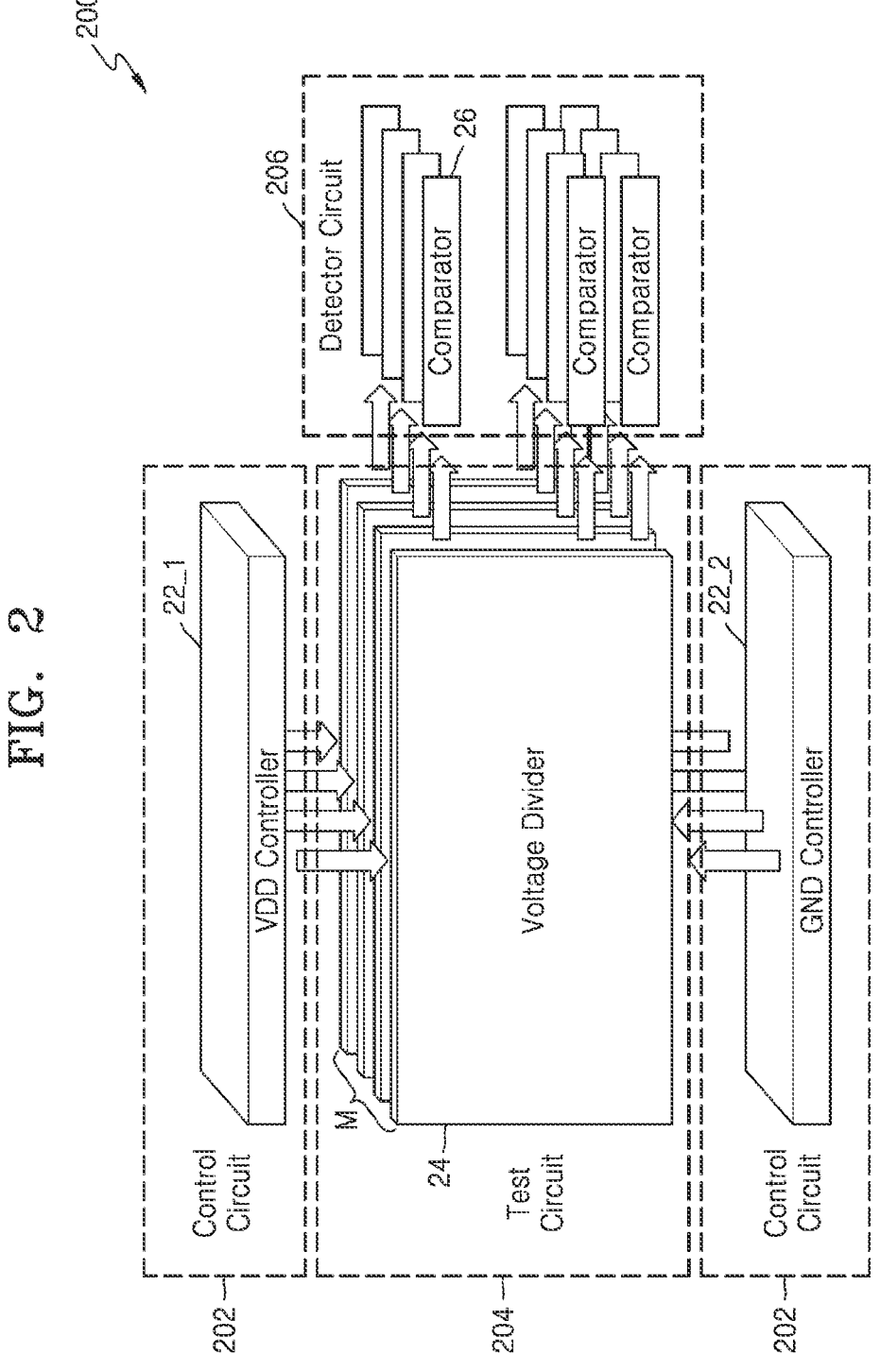
FIG. 2 illustrates a block diagram of a structure of a TSV test device according to embodiments of the inventive concepts.

FIG. 2 illustrates a block diagram of a structure of a TSV test device 200 according to embodiments of the inventive concepts. Hereinafter, description will be made with reference to FIG. 1.

Referring to FIG. 2, the TSV test device 200 may include a control circuit 202, a test circuit 204, and a detector circuit 206, and the TSV test device 200 may correspond to the TSV test device 10 in FIG. 1.

The control circuit 202 may include a VDD controller 22_1 and a GND controller 22_2. The VDD controller 22_1 and the GND controller 22_2 may respectively correspond to the VDD control circuit 12_1 and the GND control circuit 12_2 in FIG. 1. The VDD controller 22_1 and the GND controller 22_2 may be connected to TSVs, respectively generate and output enable signals and inverted enable signals to the test circuit 204, and control metal-oxide semiconductor field-effect transistor(s) (MOSFET) included in the test circuit 204. Accordingly, the VDD controller 22_1 and the GND controller 22_2 may respectively control VDD and GND connections of the test circuit 204. In embodiments, a VDD or VDD voltage may mean a positive supply voltage supplied to the TSV test device 200 or a power supply voltage applied to a drain terminal of a transistor (e.g., a zeroth common P-channel metal-oxide semiconductor (PMOS) P_C0 (in FIG. 4A)). For example, the VDD voltage may be set to 1.5 V, but the inventive concepts are not limited thereto. In addition, a GND or GND voltage may mean a ground voltage or a 0 V voltage. The VDD controller 22_1 and the GND controller 22_2 are described below with reference to FIGS. 3A and 3B.

For example, the test circuit 204 may include M (where M is any positive integer) voltage divider(s) 24, and the M voltage divider(s) 24 may be connected in parallel. Accordingly, the test circuit 204 may simultaneously test the M TSV(s) in an arbitrary time period (e.g., a time corresponding to one cycle of a clock signal CLK (in FIG. 3A)) by using a received clock signal CLK and enable signals EN0 to EN(N-1) (in FIG. 3A). As an example, one of the M voltage divider(s) 24 may be connected to N (where N is a positive integer) TSV(s) (e.g., the TSVs 15 of FIG. 1), the one of the M voltage divider(s) 24 may include (2*N) P-MOSFETs (hereinafter may be referred to as PMOS) directly connected to the N TSVs, respectively, and N N-MOSFETs (hereinafter may be referred to as NMOS). In addition, the one of the M voltage divider(s) 24 may include one PMOS and two NMOSs commonly connected to all N TSVs. Resistor(s) for minimizing an error caused by process-voltage-temperature (PVT) variation may be connected to a plurality of NMOSs and PMOSs included in the test circuit 204. A number of PMOSs, NMOSs, and resistor(s) included in the test circuit 204 may have different values depending on circumstances to prevent an operation error of the resistor(s) and implement a temperature compensation circuit. The test circuit 204 may generate particular voltage values by voltage division using the M voltage divider(s) 24, and may output the generated particular voltage values to the detector circuit 206. For example, a resistance component having a certain value may be generated between a TSV and a substrate by a pinhole generated in the TSV. When a certain voltage is applied to a TSV by the VDD controller 22_1, the voltage applied to the TSV by the resistance component between the TSV and the substrate and the MOSFET connected to the TSV may be divided, and the test circuit 204 may output a particular voltage value (e.g., V_PIN to be described in FIG. 4A to 4C) by a current passing through the TSV. An operating method of the test circuit 204 in a case where a plurality of defects and/or faults exist is described below with reference to FIGS. 4A to 4C.

The detector circuit 206 may include a plurality of comparators 26 using sensing amplifiers. The detector circuit 206 may receive, from the test circuit 204, particular voltage values (e.g., V_PIN and V_TSV to be described in FIG. 4A to 4C) corresponding to divided voltage values, and compare the received particular voltage values with a predetermined reference voltage. The detector circuit 206 may output a result value by using the plurality of comparators 26, and determine whether a TSV has a fault and/or a type of a TSV fault according to the result value.

Figure 3A:
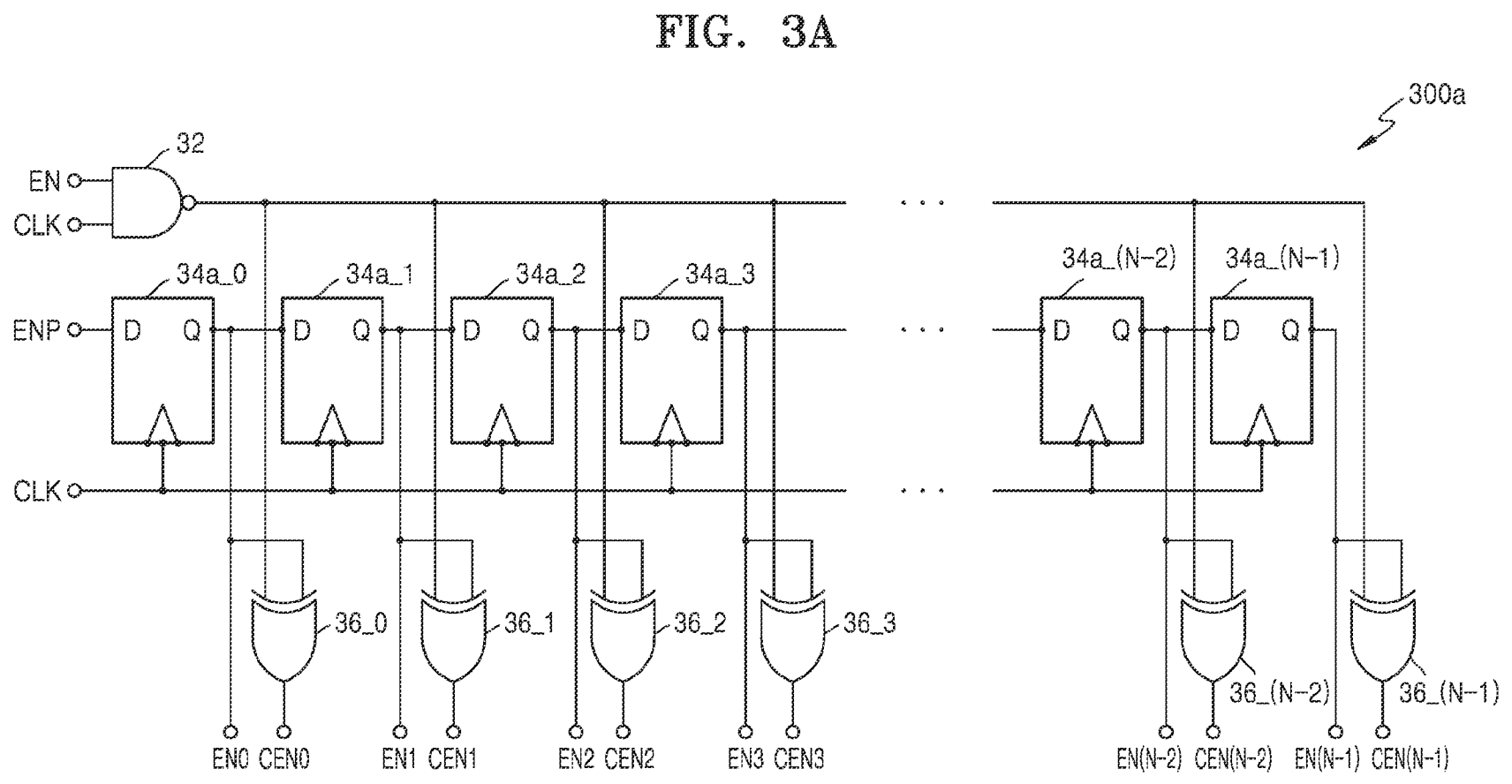

FIG. 3A illustrates a circuit diagram of a structure of a VDD control circuit 300a according to embodiments of the inventive concepts.

Referring to FIG. 3A, the VDD control circuit 300a may include a NOT-AND (NAND) gate 32, N D-flip-flops 34a_0 to 34a(N-1), and N XOR gates 36_0 to 36_(N-1). The VDD control circuit 300a may be applied to the VDD control circuit 12_1 of FIG. 1 or the VDD controller 22_1 of FIG. 2.

An EN(enable) signal EN and a clock signal CLK may be input to the NAND gate 32. According to embodiments of the inventive concepts, when a test is performed on TSVs the EN(enable) signal EN may be set to 1, and when a test is not performed on the TSVs the EN(enable) signal EN may be set to 0. The clock signal CLK may have a constant period, and a TSV may be tested according to the clock signal CLK.

The N D-flip-flops 34a_0 to 34a_(N-1) may have an enable pulse signal ENP and the clock signal CLK as inputs. For example, an N-th D-flip-flop 34a_(N-1) may output a value of the enable pulse signal ENP input at a rising edge of the clock signal CLK. According to embodiments of the inventive concepts, when a test of TSVs starts and the EN signal EN is 1, the enable pulse signal ENP may be transmitted to a next D-flip-flop by one per clock. Outputs Q of the N D-flip-flops 34a_0 to 34a_(N-1) may be respectively referred to as zeroth to (N-1)-th enable signals EN0 to EN_(N-1). The zeroth to (N-1)-th enable signals EN0 to EN_(N-1) may be respectively transmitted to gates of the N NMOSs directly connected to each of the N TSVs. The EN(enable) signal EN, the clock signal CLK and the enable pulse signal ENP may be externally provided, or may be provided by circuitry (not shown) within TSV test circuit 14 responsive to user input.

The N XOR gates 36_0 to 36_(N-1) may have an output of the NAND gate 32 and an output of each of the N D-flip-flops 34a_0 to 34a_(N-1) as inputs. For example, the outputs Q of N D-flip-flops 34*a*_0 to 34*a*_(N-1) may be respectively input to the N XOR gates 36_0 to 36_(N-1) as shown in FIG. 3A. Outputs of the N XOR gates 36_0 to 36_(N-1) may be respectively referred to as zeroth to (N-1)-th counter enable signals CEN0 to CEN(N-1). The zeroth to (N-1)-th counter enable signals CEN0 to CEN(N-1) may be respectively a signal in which the zeroth to (N-1)-th enable signals EN0 to EN(N-1) are changed according to a phase of the clock signal CLK, and may be applied to gates of PMOSs directly connected to VDD and each of the N TSVs.

Accordingly, the VDD control circuit 300*a* may control the MOSFETs of the test circuit 204 connected to TSVs by using the outputs of the N D-flip-flops 34*a*_0 to 34*a*_(N-1) and the outputs of the N XOR gates 36_0 to 36_(N-1).

Figure 3B:
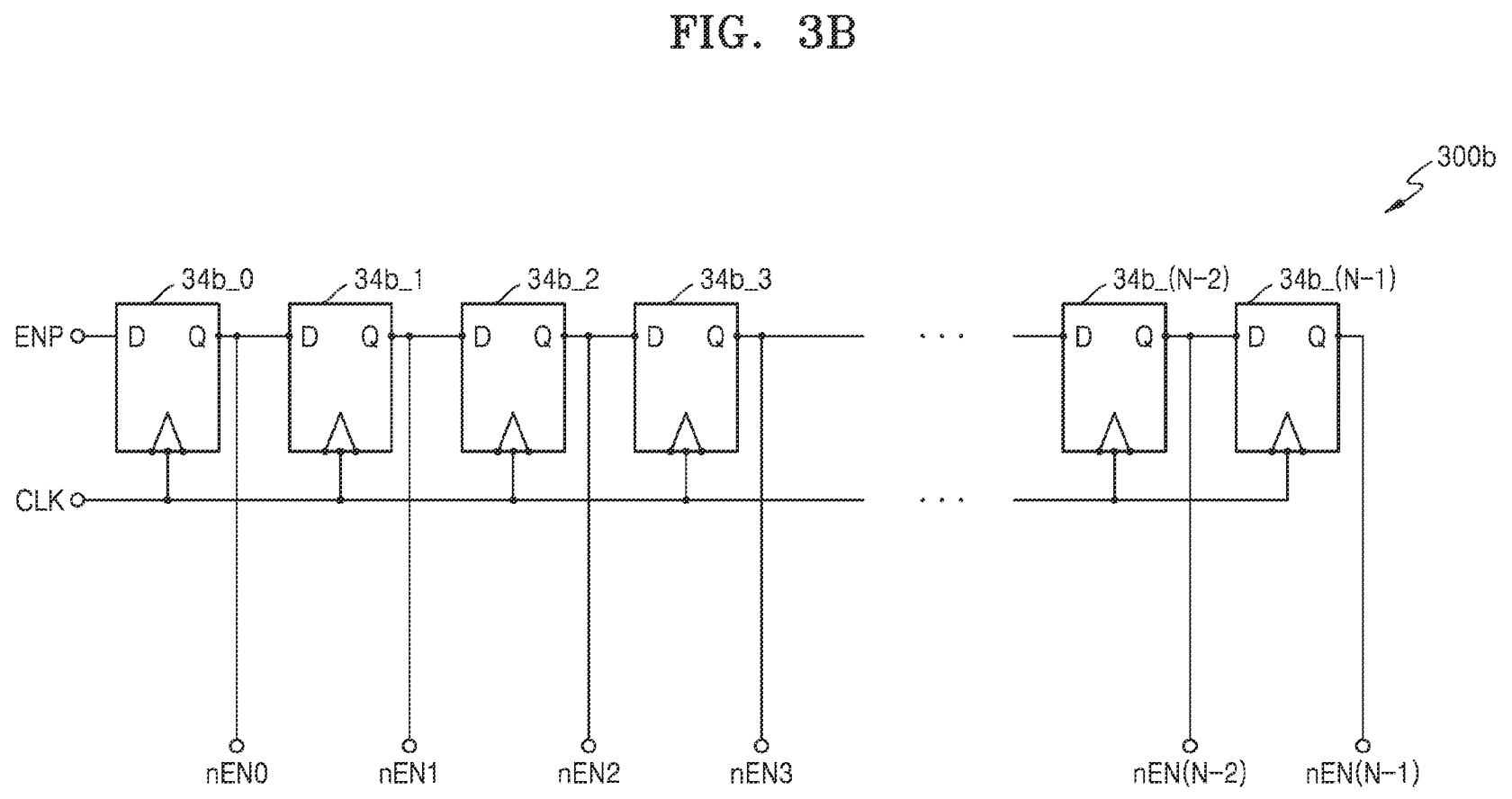

FIG. 3B illustrates a circuit diagram of a structure of a GND control circuit 300*b* according to embodiments of the inventive concepts.

Referring to FIG. 3B, the GND control circuit 300*b* may include N D-flip-flops 34*b*_0 to 34*b*_(N-1). Unlike the VDD control circuit 300*a* of FIG. 3A, the GND control circuit 300*b* does not include the NAND gate 32 and the N XOR gates 36_0 to 36_(N-1). The GND control circuit 300*b* may be applied to the GND control circuit 12_2 of FIG. 1 and the GND controller 22_2 of FIG. 2.

The N D-flip-flops 34*b*_0 to 34*b*_(N-1) may have the enable pulse signal ENP and the clock signal CLK as inputs. For example, in an N-th D-flip-flop 34*b*_(N-1), the input enable pulse signal ENP may be inverted and output at a rising edge of the clock signal CLK. According to embodiments of the inventive concepts, when a test of TSVs starts and the EN signal EN is 1, the enable pulse signal ENP may be inverted and transmitted to a next D-flip-flop by one per clock. Outputs Q of the N D-flip-flops 34*b*_0 to 34*b*_(N-1) may be respectively referred to as zeroth to (N-1)-th inverted enable signals nEN0 to nEN(N-1). The zeroth to (N-1)-th inverted enable signals nEN0 to nEN(N-1) may be respectively transmitted to gates of the N PMOSs directly connected to each of the N TSVs.

Figure 4A:
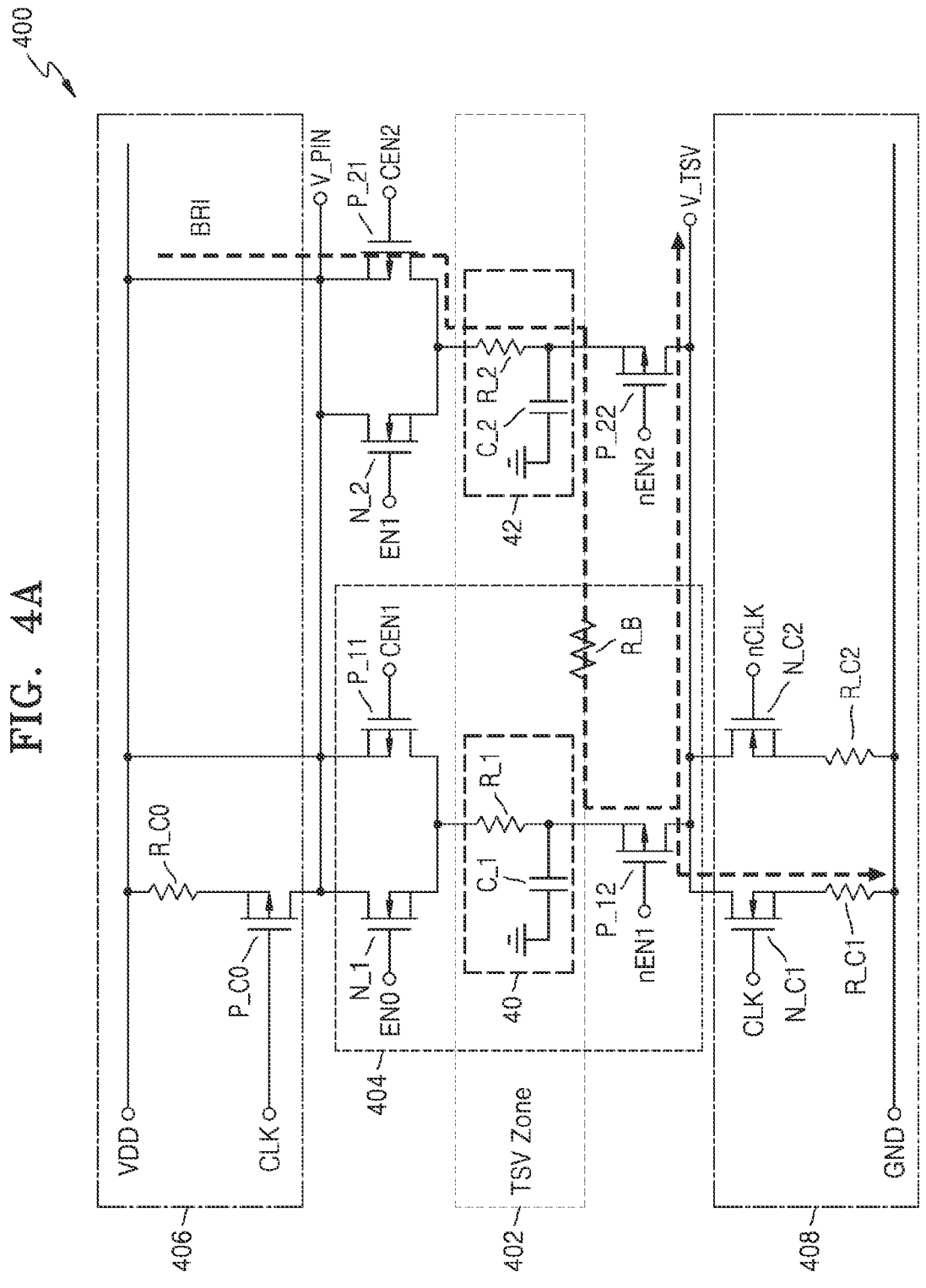
FIGS. 4A, 4B and 4C illustrate circuit diagrams of a structure of a TSV test circuit including a first TSV and a second TSV.
Figure 4B:
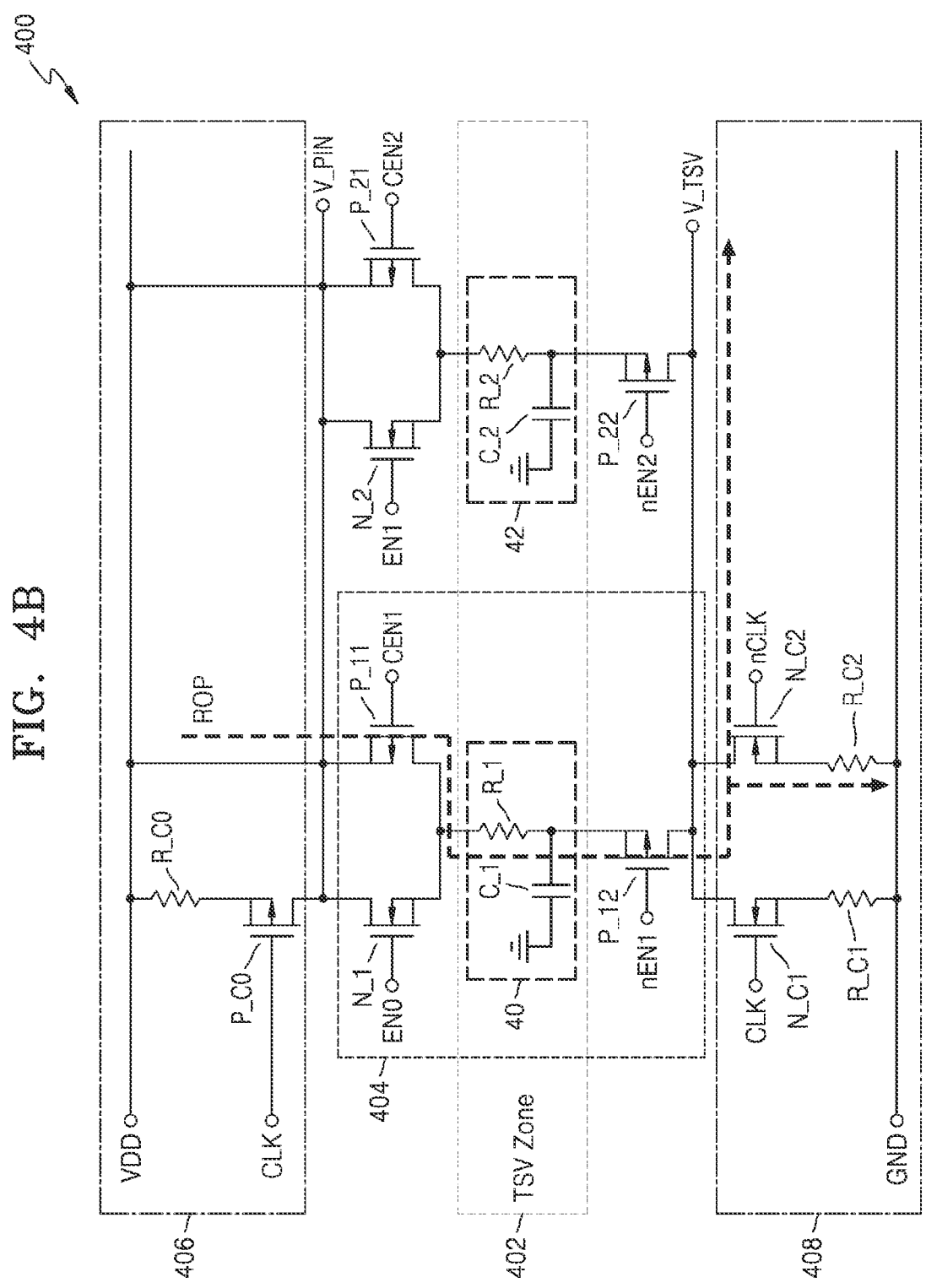
Figure 4C:
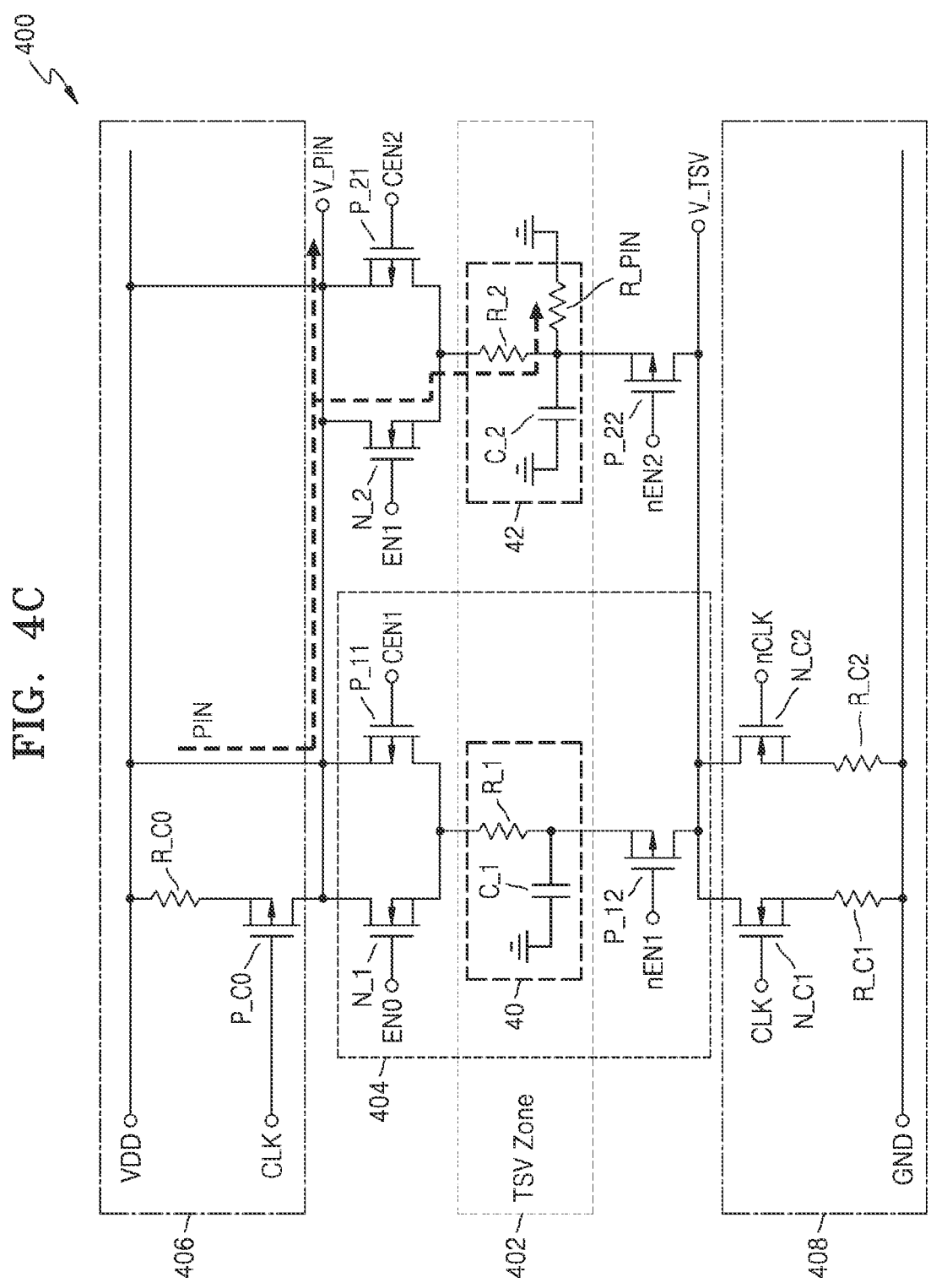

FIGS. 4A, 4B and 4C illustrate circuit diagrams each of a structure of a TSV test circuit 400 including a first TSV 40 and a second TSV 42. Hereinafter, description will be made with reference to FIGS. 3A and 3B.

Referring to FIGS. 4A to 4C, the TSV test circuit 400 may be applied to the TSV test circuit 14 of FIG. 1 or the test circuit 204 of FIG. 2, and may correspond to one of the M voltage divider(s) 24 of FIG. 2.

FIGS. 4A to 4C show a (in the narrow sense) TSV zone 402 including the first TSV 40 and the second TSV 42, and the TSV test circuit 400 including a plurality of MOSFETs, capacitors and resistors. Although the TSV test circuit 400 has been described including MOSFETs, which are a type of transistor, in FIGS. 4A to 4C the TSV test circuit 400 may be implemented as including transistors other MOSFETs, such as for example fin field-effect transistors (FINFETs), multi-bridge channel field effect transistors (MBCFETs), or the like.

In some embodiments, the TSV zone 402 may include the first TSV 40 to an N-th TSV (where N is any positive integer) (not shown), but for convenience of explanation, only two TSVs (that is, the first TSV 40 and the second TSV 42) are shown in FIGS. 4A to 4C.

The TSV zone 402 may include the first TSV 40 modeled as a first resistor R_1 and a first capacitor C_1, and a second TSV 42 modeled as a second resistor R_2 and a second capacitor C_2. For example, implementation embodiments of the first TSV 40 and the second TSV 42 are not shown, but the first TSV 40 and the second TSV 42 may have a cylindrical shape existing in a silicon substrate, and insulating layers above and below the silicon substrate.

The TSV test circuit 400 may include a first TSV test zone 404 including a plurality of MOSFETs directly connected to the first TSV 40, an upper common zone 406, and a lower common zone 408, and may be operated in a voltage division method or manner. For example, the TSV test circuit 400 may include N TSV test zones (not shown) including an N-th TSV test zone directly connected to an N-th TSV (not shown), and the upper common zone 406 and the lower common zone 408 may be commonly connected to circuits corresponding to the first TSV test zone 404 to N-th TSV test zone (not shown). The upper common zone 406 and the lower common zone 408 are commonly connected to the N TSVs included in the TSV zone 402, so that the N TSVs may share the clock signal CLK. Because the number of MOSFETs connected to each TSV included in the TSV zone 402 is three, and the upper common zone 406 and the lower common zone 408 are commonly used, the TSV test circuit 400 according to embodiments of the inventive concepts may not have large hardware overhead. In addition, a temperature compensation circuit may be relatively easily added to the TSV test circuit 400 by calibration-capable common resistors (e.g., a zeroth common resistor R_C0, a first common resistor R_C1, or a second common resistor R_C2) included in the upper common zone 406 and the lower common zone 408.

The first TSV test zone 404 may include a first NMOS N_1, a first PMOS P_11, and a second PMOS P_12, which are directly connected to the first TSV 40. At the first NMOS N_1, a zeroth enable signal EN0 may be input to a gate terminal. At the first PMOS P_11, a first counter enable signal CEN1 transmitted from the VDD control circuit 300*a* (in FIG. 3A) may be input to a gate terminal. At the second PMOS P_12, a first inverted enable signal nEN1 obtained by inverting a first enable signal EN1 transmitted from the GND control circuit 300*b* (in FIG. 3B) may be input to a gate terminal. A second TSV test zone to an N-th TSV test zone (not shown) may include a configuration similar to that of the first TSV test zone 404 (e.g., in a case of the second TSV test zone, a second NMOS N_2 corresponding to the first NMOS N_1, a third PMOS P_21 corresponding to the first PMOS P_11, and a fourth PMOS P_22 corresponding to the second PMOS P_12), and thus, redundant description thereof is omitted.

The upper common zone 406 may include the zeroth common resistor R_C0 and a zeroth common PMOS P_C0. The zeroth common resistor R C0 and the zeroth common PMOS P_C0 may be connected in series between VDD and a drain terminal of the first NMOS N_1. In addition, the zeroth common resistor R_C0 and the zeroth common PMOS P_C0 may be connected in series between the VDD and a drain terminal of the second NMOS N_2. In this way, the upper common zone 406 may also be commonly connected to a third TSV test zone to the N-th TSV test zone (not shown).

The zeroth common resistor R_C0 and the zeroth common PMOS P_C0 may be connected in series between drain terminals of a third NMOS to an N-th NMOS (not shown) included in the third TSV test zone to the N-th TSV test zone (not shown).

The lower common zone 408 may include a first common resistor R_C1, a first common NMOS N_C1, a second common resistor R_C2, and a second common NMOS N_C2. The first common resistor R_C1 and the first common NMOS N_C1 may be connected in series between GND and a drain terminal of the second PMOS P_12. The second common resistor R_C2 and the second common NMOS N_C2 may be connected in parallel to the first common resistor R_C1 and the first common NMOS N_C1, and may be connected in series between the GND and the second PMOS P_12. In addition, the first common resistor R_C1 and the first common NMOS N_C1 which are connected in series, and the second common resistor R_C2 and the second common NMOS N_C2 which are connected in series, may each be connected in parallel between the GND and a drain terminal of the fourth PMOS P_22. In this way, the lower common zone 408 may also be commonly connected to the third TSV test zone (not shown) to the Nth TSV test zone (not shown).

Common resistors may be used in the upper common zone 406 and the lower common zone 408, so that an effect by changes in an on-resistance of MOSFET(s) may be reduced, and an error due to process-voltage-temperature (PVT) variation may be minimized. In addition, a threshold resistance determining a fault of each TSV may be adjusted according to a user's setting by using the common resistors in the upper common zone 406 and the lower common zone 408.

In an embodiment, the TSV test circuit 400 may simultaneously test two TSVs for a time corresponding to one cycle of the clock signal CLK. The two TSVs may be tested for different faults from each other during any one cycle of the clock signal CLK. On average or overall, the TSV test circuit 400 may test one TSV for all TSV defects for a time corresponding to one cycle of the clock signal CLK. For example, when the clock signal CLK is 1 a test for a bridge defect and/or a Stuck-at-1 fault may be performed, and when the clock signal CLK is 0 a test for an open defect, a resistive-open defect, and/or a Stuck-at-0 fault may be performed. A cycle may also be referred to as a period.

FIG. 4A shows a flow of current in the TSV test circuit 400 when a bridge defect or a Stuck-at-1 fault is tested.

According to embodiments of the inventive concepts, when the clock signal CLK received from the VDD control circuit 300a is logic 1, a test for a bridge defect and a Stuck-at-1 fault may be performed. Logic 1 may be referred to as logic high or positive, and may be abbreviated as '1' hereinafter. Similarly, logic 0 may be referred to as logic low or negative, and may be abbreviated as '0' hereinafter.

Hereinafter, as a test of the first TSV 40 and/or the second TSV 42 is being performed, the EN signal EN is 1, the clock signal CLK received from the VDD control circuit 300a is 1, and it is assumed that a bridge defect exists between the first TSV 40 and the second TSV 42 of the TSV test circuit 400. In this case, the TSV zone 402 may include a bridge resistance R_B component having a certain value between the first TSV 40 and the second TSV 42.

When the first enable signal EN1 received from the VDD control circuit 300a is 1 and a remaining x-th enable signal ENx (where x is one of 0, and 2 to (N-1)) except the first enable signal EN1 is 0, the first counter enable signal CEN1 may be 1, and a remaining x-th counter enable signal CENx (where x is one of 0, and 2 to (N-1)) except the first counter enable signal CEN1 may be 0. At this time, because the first PMOS P_11 is turned off and the second PMOS P_12 is turned on, the first TSV 40 may be connected to the GND. In addition, at this time, because the third PMOS P_21 is turned on and the fourth PMOS P_22 is turned off, the second TSV 42 may be connected to the VDD. Similarly, third to N-th TSVs (not shown) included in the TSV zone 402 may be connected to the VDD.

Referring to FIG. 4A, when it is assumed that a bridge defect exists between the second TSV 42 corresponding to one of adjacent TSVs connected to the VDD and the first TSV 40 connected to the GND, a current may flow along a bridge line BRI, and at this time, a TSV voltage V_TSV may increase compared to a case in which a bridge defect does not exist, and may have a certain voltage value other than 0 V. When a bridge defect does not exist between the second TSV 42 and the first TSV 40 connected to the GND, the TSV voltage V_TSV may be 0 V. The TSV voltage V_TSV may be output to the detector circuit 206 (in FIG. 2), and the detector circuit 206 (in FIG. 2) may compare the TSV voltage V_TSV with a certain reference voltage, and detect whether a bridge defect exists.

The TSV test circuit 400 may test for a Stuck-at-1 fault at the same time as testing for a bridge defect.

Hereinafter, as a test is being performed, the EN signal EN is 1, the clock signal CLK received from the VDD control circuit 300a is 1, and it is assumed that a Stuck-at-1 fault exists in the first TSV 40. In this case, although the first TSV 40 is connected to the GND and not connected to the VDD, the TSV voltage V_TSV may increase and have a certain voltage value other than 0. The TSV voltage V_TSV may be output to the detector circuit 206 (in FIG. 2), and the detector circuit 206 (in FIG. 2) may compare the TSV voltage V_TSV with a reference voltage, and detect whether there is a Stuck-at-1 fault.

FIG. 4B shows a flow of current in the TSV test circuit 400 when testing for an open defect, a resistive-open defect, or a Stuck-at-0 fault.

According to embodiments of the inventive concepts, when the clock signal CLK received from the VDD control circuit 300a is 0, a test for an open defect, a resistive-open defect, and/or a Stuck-at-0 fault may be performed.

Hereinafter, as a test is being performed, the EN signal EN is 1, the clock signal CLK received from the VDD control circuit 300a is 0, and it is assumed that the first TSV 40 of the TSV test circuit 400 has an open defect or a resistive-open defect.

When the first enable signal EN1 received from the VDD control circuit 300a is 1 and the remaining x-th enable signal ENx (where x is one of 0, and 2 to (N-1)) except the first enable signal EN1 is 0, the first counter enable signal CEN1 may be 0, and the remaining x-th counter enable signal CENx (where x is one of 0, and 2 to (N-1)) except the first counter enable signal CEN1 may be 1.

At this time, because the first NMOS N_1 included in the first TSV 40 is turned off, and the first PMOS P_11 and the second PMOS P_12 are turned on, the first TSV 40 may be connected to each of the VDD and the GND. In addition, at this time, because the third PMOS P_21 and the fourth PMOS P_22 included in the second TSV 42 is turned off and the second NMOS N_2 is turned on, the second TSV 42 may be connected to the VDD. The third to N-th TSVs (not shown) included in the TSV zone 402 are floating because the third to N-th TSVs (not shown) are connected to neither the VDD nor the GND.

Referring to FIG. 4B, when it is assumed that an open defect, a resistive-open defect, or a Stuck-at-0 fault exists in the first TSV 40 connected to the VDD and the GND, an internal resistance of the first TSV 40 may increase compared to a case where an open defect, a resistive-open defect, or a Stuck-at-0 fault does not exist in the first TSV 40. When an open defect, a resistive-open defect, or a Stuck-at-0 fault does not exist in the first TSV 40, a value of the TSV voltage V_TSV may be a value corresponding to the VDD. As the internal resistance of the first TSV 40 increases, a voltage value applied to the first TSV 40 may increase when a current flows along an ROP line ROP, and the TSV voltage V_TSV may decrease by a voltage division method, or in other words because of voltage division. The TSV voltage V_TSV may be output to the detector circuit 206 (in FIG. 2), and the detector circuit 206 (in FIG. 2) may compare the TSV voltage V_TSV with a reference voltage, and detect whether there is an open defect, a resistive-open defect, or a Stuck-at-0 fault.

That is, when the clock signal CLK is 0, the detector circuit 206 may compare the TSV voltage V_TSV with a reference voltage to detect an open defect, a resistive-open defect, or a Stuck-at-0 fault for the first TSV 40.

FIG. 4C shows a flow of current in the TSV test circuit 400 when testing for a pinhole defect.

Hereinafter, as a test is being performed, the EN signal EN is 1, the clock signal CLK received from the VDD control circuit 300a is 0, and it is assumed that the second TSV 42 of the TSV test circuit 400 has a pinhole defect. In this case, the second TSV 42 may include a pinhole resistance R_PIN component having a certain value.

When the first enable signal EN1 received from the VDD control circuit 300a is 1 and the remaining x-th enable signal ENx (where x is one of 0, and 2 to (N-1)) except the first enable signal EN1 is 0, the first counter enable signal CEN1 may be 0, and the remaining x-th counter enable signal CENx (where x is one of 0, and 2 to (N-1)) except the first counter enable signal CEN1 may be 1

At this time, because the third PMOS P_21 and the fourth PMOS P_22 included in the second TSV 42 is turned off and the second NMOS N_2 is turned on, the second TSV 42 may be connected to the VDD.

Referring to FIG. 4C, when it is assumed that a pinhole defect exists in the second TSV 42 connected to the VDD, a current flows through the pinhole resistance R_PIN, and a PIN voltage V_PIN may decrease by a voltage division method (or in other words because of voltage division) when a current flows along a pin line PIN. When a pinhole defect does not exists in the second TSV 42, a value of the PIN voltage V_PIN may be a value corresponding to the VDD. The PIN voltage V_PIN may be output to the detector circuit 206 (in FIG. 2), and the detector circuit 206 (in FIG. 2) may compare the PIN voltage V_PIN with a reference voltage, and detect a pinhole defect. That is, when the clock signal CLK is 0, the detector circuit 206 may compare the PIN voltage V_PIN with a reference voltage to detect a pinhole defect for the second TSV 42.

According to a TSV test method of embodiments of the inventive concepts, when the clock signal CLK is equal to 0, a path of a current may be isolated so that the first TSV 40 may be tested for an open defect, a resistive-open defect, and/or a Stuck-at-0 fault, and the second TSV 42 instead of the first TSV 40 may be tested for a pinhole defect, thereby increasing the resolution of a test. When a resistive-open defect and a pinhole defect are simultaneously tested in the same TSV, because an internal resistance and a pinhole resistance of the second TSV 42 are connected in parallel, both of a current flowing toward the GND and a current flowing toward a substrate exist, and thus, the resolution may be lowered.

Figure 5:
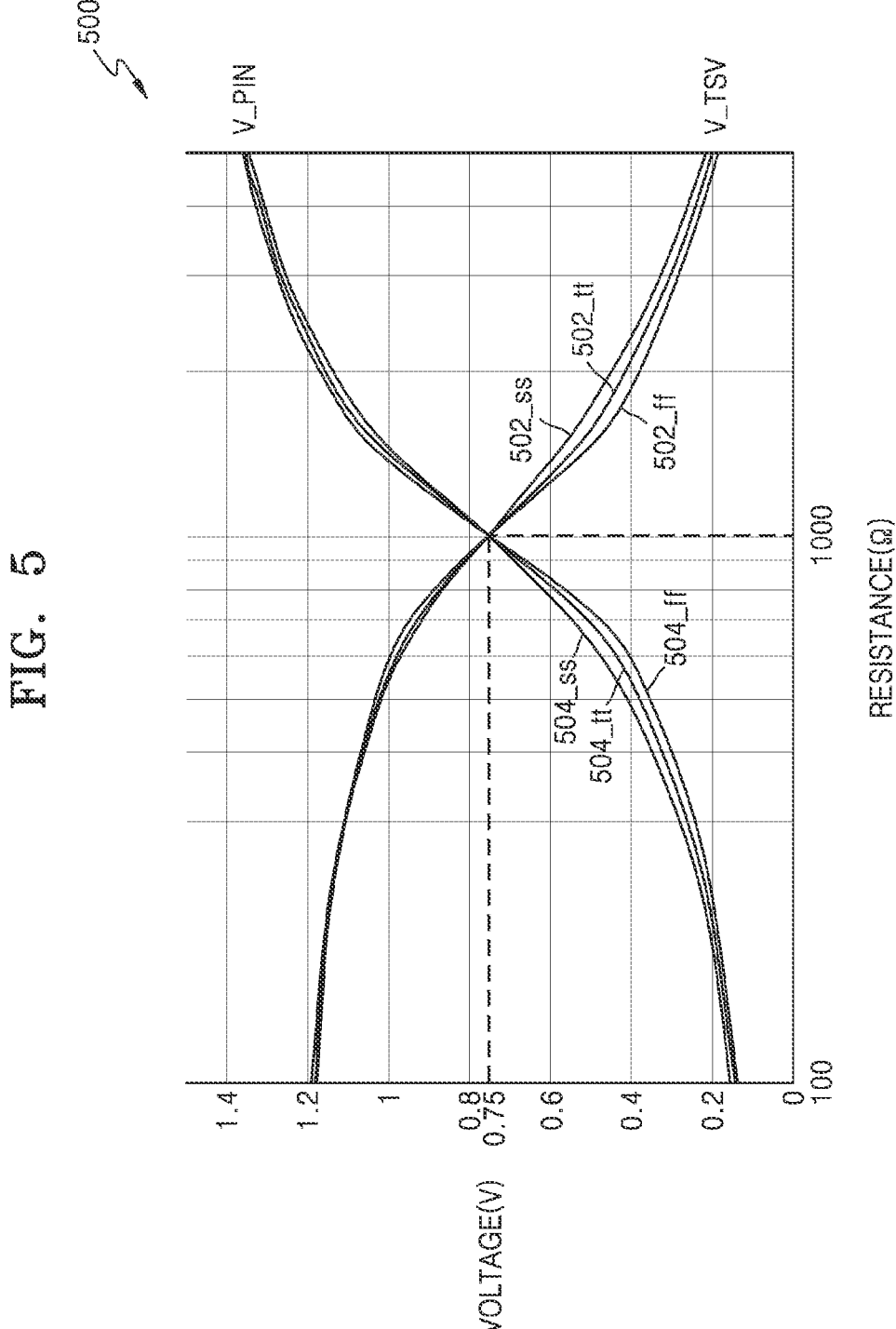
FIG. 5 illustrates a graph of a TSV voltage (V_TSV) and a PIN voltage (V_PIN) according to an internal resistance of a TSV.

FIG. 5 illustrates a graph 500 of the TSV voltage V_TSV and the PIN voltage V_PIN according to an internal resistance of a TSV. Hereinafter, description will be made with reference to FIGS. 4A to 4C.

FIG. 5 shows a graph as a result of measuring changes in the TSV voltage V_TSV and the PIN voltage V_PIN according to a change in the internal resistance of the first TSV 40 or the second TSV 42 when a VDD voltage is 1.5 V and when a target resistance for the aforementioned six defects and/or faults is set to 1000Ω.

Referring to FIGS. 4A to 4C, values of the TSV voltage V_TSV and the PIN voltage V_PIN may have different values according to the internal resistance of the first TSV 40 or the second TSV 42 and an on-resistance of MOSFETs (e.g., the first PMOS P_11 or the second NMOS N_2) included in the TSV test circuit 400. Each of the zeroth common resistor R_C0 included in the upper common zone 406 and the first common resistor R_C1 or the second common resistor R_C2 included in the lower common zone 408 of FIGS. 4A to 4C may have a variable resistance. In some embodiments, in each of the upper common zone 406 and the lower common zone 408, zeroth to second common resistors R_C0, R_C1, and R_C2 may be replaced with an NMOS(s) or a PMOS(s), an NMOS(s) or a PMOS(s) may be added, and the replaced or added NMOS(s) or PMOS(s) may be used to adjust a target resistance value.

As an example, the target resistance value may be set to 1000Ω, and the zeroth to second common resistors R_C0, R_C1, and R_C2 may be adjusted so that a value of each of the TSV voltage V_TSV and the PIN voltage V_PIN is 0.75 V corresponding to ½ times of the VDD voltage value when the internal resistance value of the first TSV 40 or the second TSV 42 is 1000Ω. The target resistance may mean a reference resistance and a threshold resistance for determining whether the TSV has a defect and/or a fault. Setting the target resistance value to 1000Ω is only an example, and the target resistance value may be set to another value. For example, when the TSV test circuit 400 (in FIGS. 4A to 4C) is more precisely configured to increase a TSV defect detection rate, a user may set the target resistance value to a value less than 1000Ω. When the target resistance value is set to 300Ω, the zeroth common resistor R_C0, the first common resistor R_C1, and/or the second common resistor R_C2 may be adjusted such that the value of each of the TSV voltage V_TSV and the PIN voltage V_PIN is 0.75 V.

FIG. 5 is a result of a process corner simulation, and shows a graph of a simulation result by dividing the PMOS(s) and the NMOS(s) included in the TSV test circuit 400 of FIGS. 4A to 4C into a fast-fast (ff) case where an operation speed of each is fast, a typical-typical (tt) case where an operation speed of each is typical, and a slow-slow (ss) case where an operation speed of each is slow.

The TSV voltage V_TSV may have a smaller value as the internal resistance value of the first TSV 40 or the second TSV 42 increases, and the PIN voltage V_PIN may have a larger value as the internal resistance value of the first TSV 40 or the second TSV 42 increases. Depending on whether a bridge defect, an open defect, a resistive-open defect, a Stuck-at-0 fault, a Stuck-at-1 fault, or a pinhole defect exists, the TSV voltage V_TSV and the PIN voltage V_PIN may have different values.

For example, when a TSV voltage V_TSV graph 502_*ff* in a case where an operation speed of each of the PMOS(s) and the NMOS(s) included in the TSV test circuit 400 of FIGS. 4A to 4C is fast is compared with a TSV voltage V_TSV graph 502_*ss* in a case where the operation speed of each is slow or a TSV voltage V_TSV graph 502_*tt* in a case where the operation speed of each is typical, a value of the TSV voltage V_TSV may be reduced to a greater extent when the internal resistance value of the first TSV 40 or the second TSV 42 is slightly greater than 1000Ω. In addition, as an example, when a PIN voltage V_PIN graph 504_*ff* in a case where the operation speed of each of the PMOS(s) and the NMOS(s) included in the TSV test circuit 400 of FIGS. 4A to 4C is fast is compared with a PIN voltage V_PIN graph 504_ss in a case where the operation speed of each is slow or a PIN voltage V_PIN graph 504_tt in a case where the operation speed of each is typical, the value of the PIN voltage V_PIN may increase in a greater extent when the internal resistance value of the first TSV 40 or the second TSV 42 is slightly greater than 1000Ω.

When a bridge defect exists between the first TSV 40 and the second TSV 42, the detector circuit 206 (in FIG. 2) may determine that there is no fault when the value of the TSV voltage V_TSV is less than 0.75 V, and the detector circuit 206 (in FIG. 2) may determine that there is a fault when the value of the TSV voltage V_TSV is greater than 0.75 V.

When an open defect, a resistive-open defect, or a Stuck-at-0 fault exists in the first TSV 40, because there is an effect that the internal resistance value of the first TSV 40 is increased, the detector circuit 206 (in FIG. 2) may determine there is no fault when the value of the TSV voltage V_TSV is greater than 0.75 V, and the detector circuit 206 (in FIG. 2) may determine that there is a fault when the value of the TSV voltage V_TSV is less than 0.75 V.

When a pinhole defect exists in the second TSV 42, because a current flows from the second TSV 42 to the substrate by the pinhole resistance R_PIN component, the detector circuit 206 (in FIG. 2) may determine there is a fault when the value of the PIN voltage V_PIN is less than 0.75 V, and the detector circuit 206 (in FIG. 2) may determine that there is no fault when the value of the PIN voltage V_PIN is greater than 0.75 V.

Referring to FIG. 5, according to a TSV test device or method of embodiments of the inventive concepts, when the internal resistance value of the first TSV 40 or the second TSV 42 increases or decreases from the target resistance value of 1000Ω, the value of each of the TSV voltage V_TSV and the PIN voltage V_PIN is relatively greatly increased or decreased, and thus, errors due to noise that may be generated in actual implementation may be reduced.

In addition, referring to FIG. 5, a highest resolution may be obtained from the set target resistance value, and errors due to process variations that may occur during an operation may be minimized. According to a TSV test device and method according to embodiments of the inventive concepts, because a reference voltage value is always set to VDD/2 for all six defects and/or faults, there is no need to set various reference values for determining TSV defects, and thus, a defect detector circuit (16 in FIG. 1 or 206 in FIG. 2) may be shared in an HBM in which a plurality of DRAM dies are stacked, and TSVs may be efficiently tested without significantly increasing hardware overhead.

Figure 6:
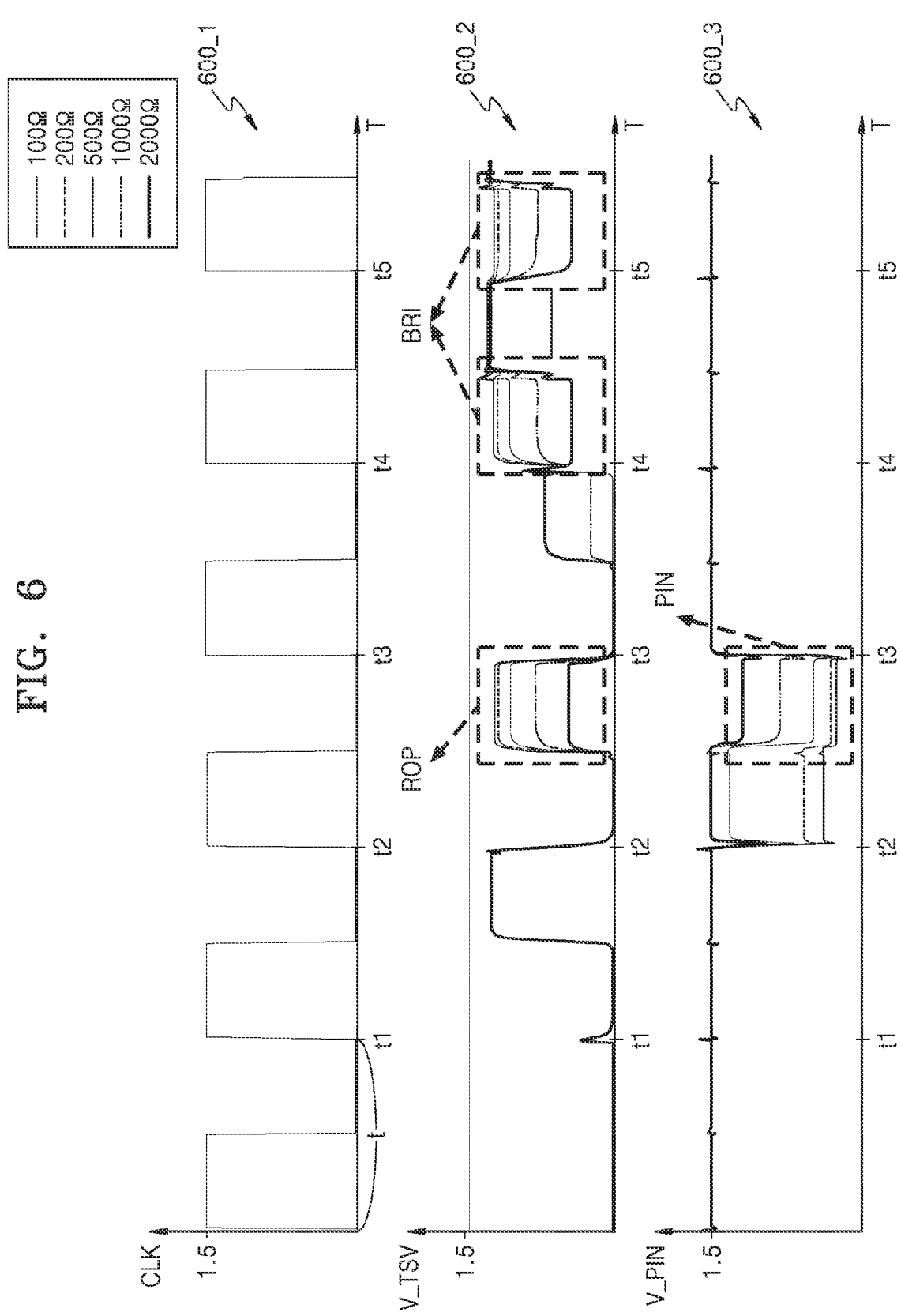
FIG. 6 illustrates an example of a timing diagram of measurement results of the TSV voltage (V_TSV) and the PIN voltage (V_PIN) of FIG. 5 according to a clock signal (CLK)

FIG. 6 exemplarily illustrates a timing diagram of the TSV voltage V_TSV and the PIN voltage V_PIN of FIG. 5 according to the clock signal CLK. In particular, FIG. 6 exemplarily shows a timing diagram 600_1 of the clock signal CLK, a timing diagram 600_2 of the TSV voltage V_TSV, and a timing diagram 600_3 of the PIN voltage V_PIN.

FIG. 6 is a timing diagram showing measurement values of the TSV voltage V_TSV and the PIN voltage V_PIN of FIG. 5 according to the clock signal CLK, as a result of setting a simulation program and operating simulation so that a resistive-open defect exists in the first TSV 40 (in FIG. 4B), a pinhole defect exists in the second TSV 42 (in FIG. 4C), and a bridge defect exists between a third TSV and a fourth TSV. It is assumed that target resistance values for determining faults caused by a resistive-open defect, a bridge defect, and a pinhole defect through a simulation program are all set to 1000Ω. The third TSV and the fourth TSV may be connected in parallel to the first TSV 40 or the second TSV 42.

According to the timing diagram 600_1 of the clock signal CLK, the clock signal CLK may be defined as a square wave signal in which one clock has a period of time T=t. For example, a duration from T=0 to T=t1 may be referred to as a first period, a duration from T=t1 to T=t2 may be referred to as a second period, and hereinafter, a third period to an N-th period (where N is any positive integer) are similar to the above, and thus, redundant description thereof is omitted.

According to the timing diagram 600_2 of the TSV voltage V_TSV and the timing diagram 600_3 of the PIN voltage V_PIN, as a reset signal is input at any time within the first period, the TSV voltage V_TSV and the PIN voltage V_PIN in a normal state without any defects in the first TSV 40 or the second TSV 42 in the second period are respectively shown.

As an embodiment, after T=t2, a simulation program may be set such that a bridge defect exists between the third TSV and the fourth TSV, and a resistive-open defect exists in the first TSV 40, and during the third period and the fourth period, a test performance result for the resistive-open defect in the first TSV 40 and the bridge defect between the third TSV and the fourth TSV may be obtained. In addition, after T=t2, a simulation program may be set so that a pinhole defect exists in the second TSV 42, and during the second period, a test performance result for the pinhole defect in the second TSV 42 may be obtained.

According to a test method and device of embodiments of the inventive concepts, different TSVs may be sequentially tested in every period. Referring to FIG. 2, considering that the test circuit 204 includes M voltage divider(s) 24, in total, M TSVs may be tested in one clock period. TSVs tested at the same time may be designed such that TSVs spaced apart by a distance greater than or equal to a certain distance are selected so as not to be affected by a bridge defect between them.

As it is assumed that a resistive-open defect exists in the first TSV 40, when the clock signal CLK is 0 in the third period, it may be tested whether the first TSV 40 has a resistive-open defect, and the timing diagram 600_2 of the TSV voltage V_TSV shows respective TSV voltages V_TSV when the internal resistance values of the first TSV 40 are 100Ω, 200Ω, 500Ω, 1000Ω, and 2000Ω. In a case of a resistive-open defect, it may be determined that a resistive-open defect exists when the TSV voltage V_TSV has a value less than 0.75 V, which is a reference voltage value for determining a fault. Referring to the timing diagram 600_2 of the TSV voltage V_TSV, the TSV voltage V_TSV decreases as the internal resistance value of a TSV increases, and for example, when the internal resistance value of the TSV is 2000Ω, the TSV voltage V_TSV is measured to be about 0.4 V, which is less than 0.75 V, and thus, a TSV fault due to a resistive-open defect may be relatively easily determined.

As it is assumed that a pinhole defect exists in the second TSV 42, the pinhole defect in the second TSV 42 may be simultaneously tested with the resistive-open defect in the first TSV 40 when the clock signal CLK is 0 in a third clock period, and the timing diagram 600_3 of the PIN voltage V_PIN shows respective PIN voltages V_PIN when the internal resistance values of the second TSV 42 are 100Ω, 200Ω, 500Ω, 1000Ω, and 2000Ω. As described above with reference to FIG. 4C, when the clock signal CLK is equal to 0, the pinhole defect may be tested for the second TSV 42 instead of the first TSV 40 for resolution.

In a case of a pinhole defect, it may be determined that a pinhole defect exists when the PIN voltage V_PIN has a value less than 0.75 V, which is a reference voltage value for determining a fault. Referring to the timing diagram 600_3 of the PIN voltage V_PIN, the PIN voltage V_PIN increases as the internal resistance value of a TSV increases, and for example, when the internal resistance value of the TSV is 500Ω, the PIN voltage V_PIN is measured to be about 0.4 V, which is less than 0.75 V, and thus, a TSV fault due to a pin hole defect may be relatively easily determined.

As it is assumed that a bridge defect exists between the third TSV and the fourth TSV, it may be tested whether each of the third TSV and the fourth TSV has a bridge defect when the clock signal CLK is 1 in fifth and sixth periods. The timing diagram 600_2 of the TSV voltage V_TSV shows respective TSV voltages V_TSV when the internal resistance values of the third TSV and the fourth TSV are 100Ω, 200Ω, 500Ω, 1000Ω, and 2000Ω.

In a case of a bridge defect, it may be determined that a bridge defect exists when the TSV voltage V_TSV has a value greater than 0.75 V, which is a reference voltage value for determining a fault. Referring to the timing diagram 600_2 of the TSV voltage V_TSV, the TSV voltage V_TSV decreases as the internal resistance value of a TSV increases, and for example, when the internal resistance value of the TSV is 100Ω, the TSV voltage V_TSV is measured to be about 1.2 V, which is greater than 0.75 V, and thus, a TSV fault due to a bridge defect may be relatively easily determined. Because a bridge defect is not a fault for one TSV but a type where two TSVs are involved, a fault due to a bridge defect may be detected not only when testing a bridge defect for the third TSV in the fifth period but also when testing a bridge defect for the fourth TSV in the sixth period.

Figure 7:
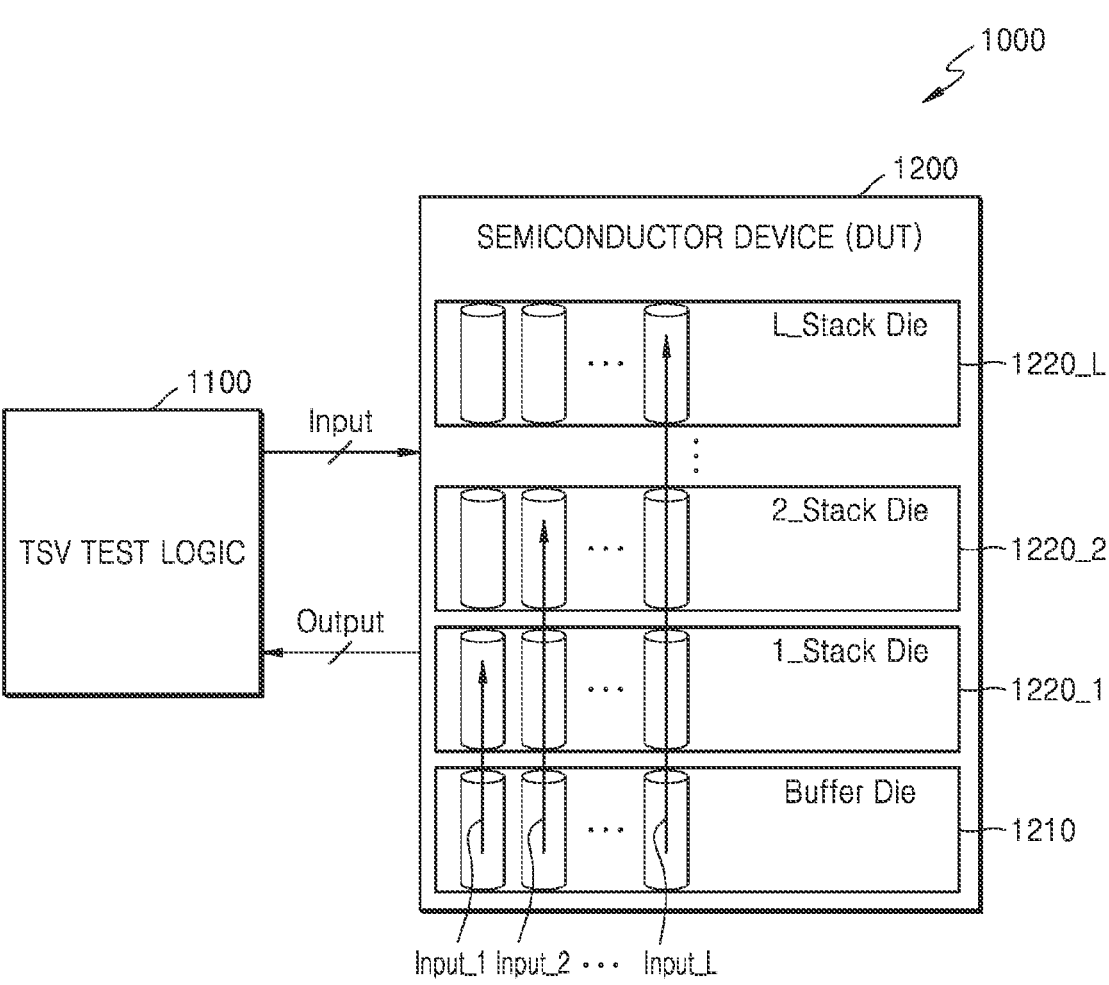
FIG. 7 illustrates a block diagram of a test system including a semiconductor device according to embodiments of the inventive concepts.

FIG. 7 illustrates a block diagram of a test system 1000 including a semiconductor device 1200 according to embodiments of the inventive concepts.

Referring to FIG. 7, the test system 1000 for testing the semiconductor device 1200 may include a TSV test logic (or TSV test device) 1100 and a semiconductor device 1200 as a device under test (DUT) to be tested. As an embodiment, the test system 1000 may be referred to as a test device. In addition, as an embodiment, components other than the semiconductor device 1200 in the test system 1000 may be defined as test devices. As the TSV test logic 1100, the TSV test device 10 of FIG. 1 or the TSV test device 200 of FIG. 2 may be applied.

The test system 1000 may include a test board (not shown), and the test board may include a DUT mounting circuit on which the semiconductor device 1200 is mounted as one or more DUTs. In addition, the TSV test logic 1100 may be mounted on the test board or provided outside the test board to control a test operation of the semiconductor device 1200. In addition, the DUT mounting circuit may include a plurality of sockets for mounting DUTs, and as a plurality of semiconductor devices 1200 are mounted on the DUT mounting circuit in the test system 1000, parallel tests for the plurality of DUTs may be performed.

Although not illustrated in FIG. 7, the test system 1000 may also include a communication device that communicates with an external host requiring a test, a memory that temporarily stores various types of information related to various tests, and a power supply circuit (above, not shown) that provides power to various devices included in the test system 1000.

According to an embodiment, the TSV test logic 1100 may be implemented as a semiconductor chip such as a field programmable gate array (FPGA), an application specific integrated circuit (ASIC), an application processor (AP), or the like. The TSV test logic 1100 may transmit/receive various types of information to/from the semiconductor device 1200 according to a parallel communication method therebetween. In some embodiments, the TSV test logic 1100 may be included in the semiconductor device 1200.

For example, the semiconductor device 1200 may include a plurality of semiconductor dies in a stacked structure, and the plurality of semiconductor dies may include a buffer die 1210 communicating with the TSV test logic 1100 at the outside or an external memory controller (not shown), and a plurality of stacked dies 1220_1 to 1220_L stacked on the buffer die 1210, where L for example is an integer greater than or equal to 2. The TSV test logic 1100 may perform tests for the plurality of stacked dies 1220_1(or 1_Stack Die) to 1220_L (or L_Stack Die) of the semiconductor device 1200 in parallel, and for example, the TSV test logic 1100 may output test inputs Input_1 to Input_L provided to the plurality of stacked dies 1220_1 to 1220_L in parallel (or simultaneously). In addition, the buffer die 1210 may receive the test inputs Input_1 to Input_L in parallel.

A test operation of determining whether a semiconductor device is defective may be performed at various stages of a semiconductor operation, and for example, may include a wafer level test and a post-wafer level test. The wafer level test may correspond to a test for individual semiconductor dies at a wafer level. In addition, the post-wafer level test may be a test for a semiconductor die before packaging is performed, or a test on a semiconductor package in which one semiconductor die (or semiconductor chip) is packaged. Alternatively, a test for a semiconductor package may be a test for a semiconductor package including a plurality of semiconductor chips.

According to an embodiment, when the test system 1000 shown in FIG. 7 is a device performing a wafer level test, the semiconductor device 1200 may be a semiconductor die formed on a semiconductor wafer, and the semiconductor die may include the buffer die 1210 and the plurality of stacked dies 1220_1 to 1220_L formed through a semiconductor operation. Alternatively, when the test system 1000 shown in FIG. 7 is a device testing a semiconductor package, the semiconductor device 1200 may be a semiconductor package in which a plurality of semiconductor dies (or semiconductor chips) are vertically stacked and packaged.

The semiconductor device 1200 may be a device performing various functions, and as an example, the semiconductor device 1200 may be a memory device including a memory cell array. For example, the memory device may be dynamic random access memory (DRAM) such as double data rate synchronous dynamic random access memory (DDR SDRAM), lower power double data rate (LPDDR) SDRAM, graphics double date rate (GDDR) SDRAM, rambus dynamic random access memory (RDRAM®), or the like. Alternatively, the memory device may correspond to a non-volatile memory such as a flash memory, magnetic random access memory (MRAM), ferroelectric RAM (Fe-RAM), phase change RAM (PRAM), resistive RAM (Re-RAM), or the like.

According to an embodiment, the test inputs Input_1 to Input_L from the TSV test logic 1100 may be provided to the buffer die 1210 of the semiconductor device 1200 in parallel. In addition, the buffer die 1210 may communicate with the plurality of stacked dies 1220_1 to 1220_L through a plurality of through electrodes, and as an example, the buffer die 1210 may communicate with the plurality of stacked dies 1220_1 to 1220_L through a plurality of TSVs. Although a plurality of test inputs Input_1 to Input_L are shown as being provided to the buffer die 1210 in FIG. 7, as an example, the test inputs Input_1 to Input_L may have a number corresponding to that of the plurality of stacked dies 1220_1 to 1220_L. Alternatively, the test input Input_1 to Input_L is commonly provided to the plurality of stacked dies 1220_1 to 1220_L, and the buffer die 1210 may branch and provide the Input to the plurality of stacked dies 1220_1 to 1220_L. Alternatively, when each of the plurality of stacked dies 1220_1 to 1220_L includes a plurality of channels each performing an interface independent of each other, and a separate test operation is performed for each of the plurality of channels, a number of test inputs Input_1 to Input_L may be greater than the number of the plurality of stacked dies 1220_1 to 1220_L. In an embodiment, the test inputs Input_1 to Input_L commonly provided to the plurality of stacked dies 1220_1 to 1220_L may include the clock signal CLK, the zeroth to (N-1)-th enable signals EN0 to EN(N-1), the zeroth to (N-1)-th counter enable signals CEN0 to CEN(N-1), and/or zeroth to (N-1)-th inverted enable signals nEN0 to nEN(N-1).

Figure 8:
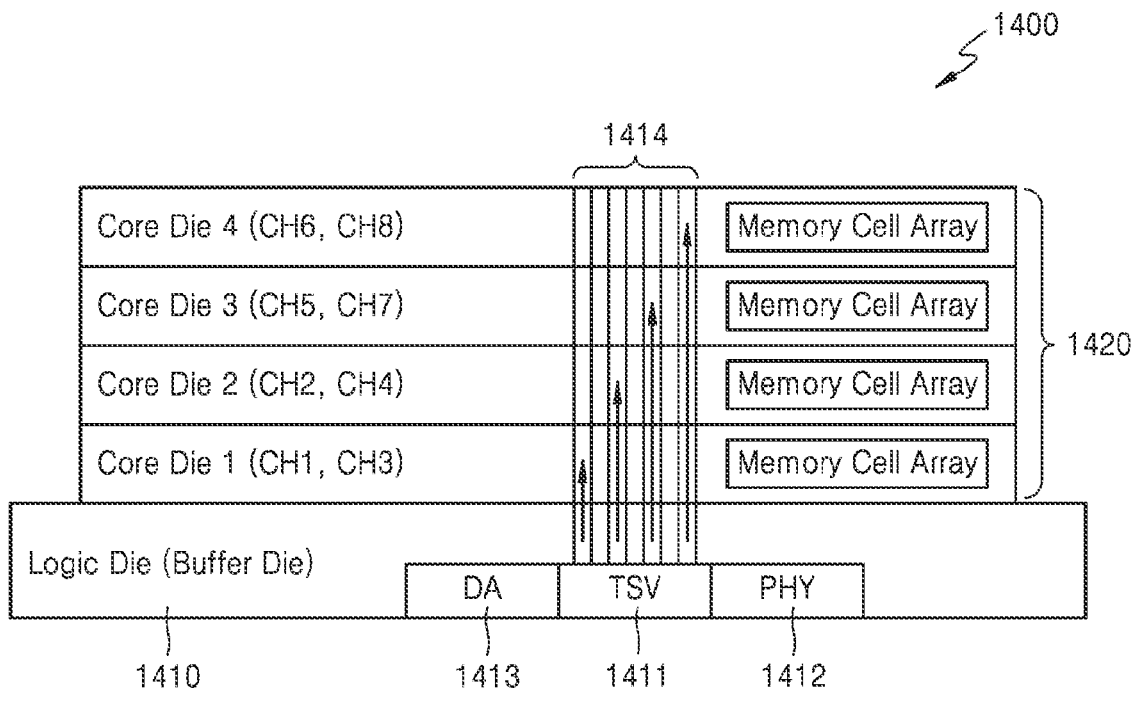
FIG. 8 illustrates a block diagram of an example in which the semiconductor device of FIG. 7 is implemented as a high bandwidth memory (HBM)

FIG. 8 illustrates a block diagram of an example in which the semiconductor device 1200 of FIG. 7 is implemented as an HBM 1400.

Referring to FIG. 8, the HBM 1400 may include a plurality of semiconductor dies, and for example, may include a logic die (or the buffer die 1410) and one or more core dies 1420 each including a memory cell array. The one or more core dies 1420 may correspond to the plurality of stacked dies 1220_1 to 1220_L of FIG. 7 described above. The HBM 1400 may have an increased bandwidth by including a plurality of channels CH1 to CH8 each having an interface independent from each other, and in FIG. 8, as an example, an example in which the HBM 1400 includes four core dies 1420 and each of the core dies 1420 includes two channels is shown. However, a number of core dies 1420 and a number of channels CH1 to CH8 included in the HBM 1400 may be variously changed.

The logic die 1410 may include a TSV zone 1411, a physical (PHY) zone 1412, and a direct access (DA) zone 1413. In addition, the logic die 1410 may further include a control logic (not shown) controlling the overall operation of the HBM 1400, and as an example, and may perform an internal control operation of the HBM 1400 in response to a command from an external controller.

The TSV zone 1411 of the logic die 1410 may correspond to a zone in which TSVs for communication with the core dies 1420 are formed, and a TSV zone 1414 of the core dies 1420 may correspond to a zone in which TSVs for communication with the logic die 1410 are formed. For example, TSV test devices according to embodiments of the inventive concepts may be connected to each of the TSV(s) included in the TSV zone 1411 of the logic die 1410 and/or the TSV zone 1414 of the core dies 1420 in a wire-bonding method, and may be built-in to the HBM 1400.

The PHY zone 1412 may include a plurality of input/output circuits for connection with an external controller, and the direct access DA zone 1413 may directly communicate with an external tester through a conductive unit arranged on an outer surface of the HBM 1400 in a test mode for the HBM 1400. Various signals provided from the tester may be provided to the core dies 1420 through the direct access DA zone 1413 and the TSV zone 1411 of the logic die 1410.

Figure 9:
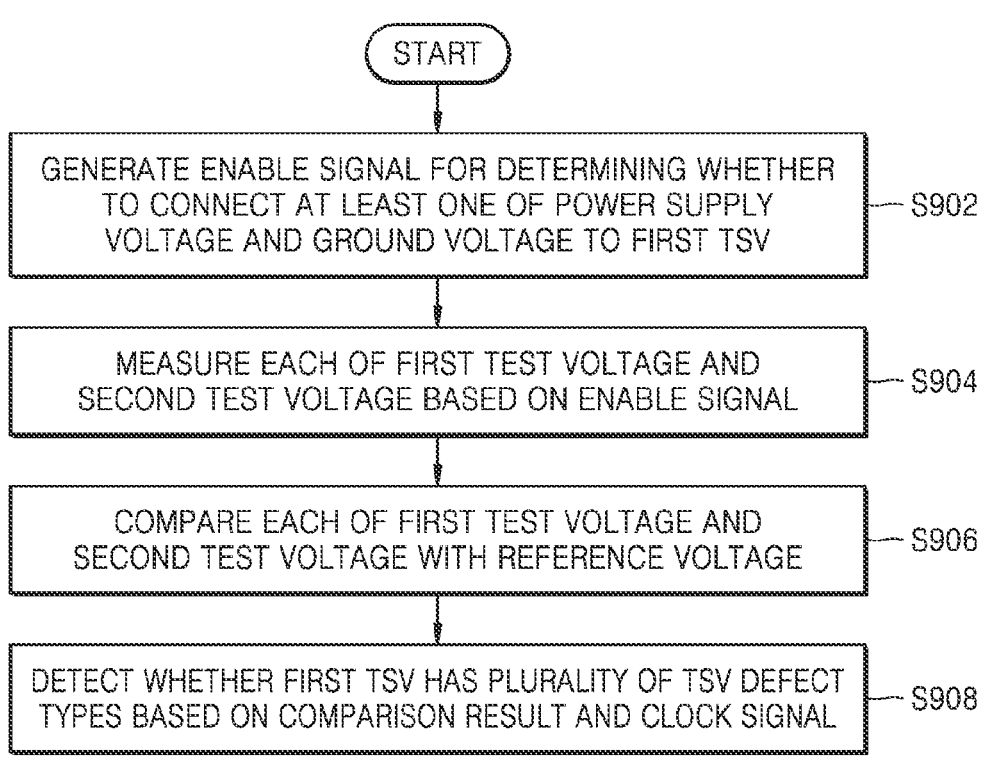
FIG. 9 illustrates a flowchart of an example of an operating method of the semiconductor device of FIG. 1.

FIG. 9 illustrates a flowchart of an example of an operating method of the semiconductor device 100 of FIG. 1. Hereinafter, descriptions will be made with reference to FIGS. 1 to 4C.

In operation S902, the semiconductor device 100 (or the TSV test device 10) generates an enable signal determining whether to connect at least one of a power supply voltage and a ground voltage to a first TSV. In particular, the VDD control circuit 12_1 included in the TSV test device 10 may generate and output the zeroth to (N-1)-th enable signals EN0 to EN(N-1) to the TSV test circuit 14, and generate and output the zeroth to (N-1)-th counter enable signals CEN0 to CEN(N-1) to the TSV test circuit 14 by using the zeroth to (N-1)-th enable signals EN0 to EN(N-1). In addition, the GND control circuit 12_2 included on the TSV test device 10 may generate and output the zeroth to (N-1)-th inverted enable signals nEN0 to nEN(N-1) to the TSV test circuit 14. Accordingly, the semiconductor device 100 may sequentially test different TSVs in every period.

In operation S904, the semiconductor device 100 (or the TSV test device 10) measures each of a first test voltage and a second test voltage according to an enable signal. In other words, the semiconductor device 100 (or the TSV test device 10) may test whether a bridge defect or a Stuck-at-1 fault exists; an open defect, a resistive-open defect, or a Stuck-at-0 fault exists; and a pinhole defect exists in any TSV. In particular, the TSV test circuit 14 included in the TSV test device 10 may measure the first test voltage and the second test voltage for testing the abovementioned six defects and/or faults based on the zeroth to (N-1)-th enable signals EN0 to EN(N-1), the zeroth to (N-1)-th counter enable signals CEN0 to CEN(N-1), the zeroth to (N-1)-th inverted enable signals nEN0 to nEN(N-1), and the clock signal CLK, which are input. The first test voltage may be referred to as the TSV voltage V_TSV or a voltage of an end of an arbitrary TSV. The second test voltage may be referred to as the PIN voltage V_PIN or a voltage of another end of the arbitrary TSV.

In operation S906, the semiconductor device 100 (or the TSV test device 10) compares each of the first test voltage and the second test voltage with a reference voltage. In particular, the defect detector circuit 16 included in the TSV test device 10 may compare each of the input first test voltage and the second test voltage with a predetermined reference voltage, and output a comparison result value. The reference voltage may be set to be half of the power supply voltage in common to the above-mentioned six defects and/or faults.

In operation S908, the semiconductor device 100 (or the TSV test device 10) detects whether the first TSV has a plurality of TSV defect types (e.g., the aforementioned six defects and/or faults) based on the comparison result value and the clock signal CLK.

The TSV test device 10 included in the semiconductor device 100 may determine whether the first TSV is a first fault corresponding to a bridge defect or a Stuck-at-1 fault, a second fault corresponding to an open defect, a resistive-open defect, or a Stuck-at-0 fault, or a third fault corresponding to a pinhole defect.

In an embodiment, the semiconductor device 100 may determine whether the first TSV and the second TSV included in N TSVs have a plurality of TSV defect types (e.g., the aforementioned six defects and/or faults) during the first period and the second period of the clock signal CLK in one voltage divider. The TSV test device 10 may test two or more different TSV defect types for any TSV during one period of a clock signal CLK. TSVs spaced apart by a constant distance or more may be selected so that the first TSV and the second TSV are not affected by a bridge defect between them.

For example, the first TSV and the second TSV may be tested during the first period of the clock signal CLK. When the clock signal CLK is 1, it may be detected whether the first TSV has a first fault. When the clock signal CLK is 0, it may be detected whether the first TSV has a second fault and it may be detected whether the second TSV has a third fault.

In addition, the first TSV and the second TSV may be tested during the second period of the clock signal CLK. When the clock signal CLK is 1, it may be detected whether the second TSV has a first fault. When the clock signal CLK is 0, it may be detected whether the first TSV has a third fault and it may be detected whether the second TSV has a second fault.

From a viewpoint of the first TSV or the second TSV, a test is performed twice during two periods of the clock signal CLK. On the contrary, from a viewpoint of the semiconductor device 100 including the TSV test device 10, on average, a test may be performed for all of a plurality of defects and/or faults (e.g., the aforementioned six defects and/or faults) for one TSV in one period of the clock signal CLK.

Embodiments of the inventive concepts may include a method of manufacturing a semiconductor device as including forming the semiconductor device, and subsequently testing the semiconductor device. The semiconductor device may be formed such as shown in FIG. 7 for example, as including a buffer die, and first to L-th stack dies stacked on the buffer die and communicating with the buffer die through N through-silicon vias (TSVs), wherein L is an integer greater than or equal to 2, and N is a positive integer. The testing of the semiconductor device may be carried out as described with respect to FIG. 9 for example, and may include generating an enable signal for determining whether to connect at least one of a power supply voltage and a ground voltage to a first TSV from among the N TSVs; measuring a first test voltage or a second test voltage provided by voltage division based on a voltage applied to the first TSV according to the enable signal; comparing the first test voltage or the second test voltage with a reference voltage; and detecting whether the first TSV has a fault based on a comparison result. The detecting of whether the first TSV has a fault may include detecting whether the first TSV has a first fault corresponding to a bridge defect or a Stuck-at-1 fault; a second fault corresponding to an open defect, a resistive-open defect, or a Stuck-at-0 fault; or a third fault corresponding to a pinhole defect.

Figure 10:
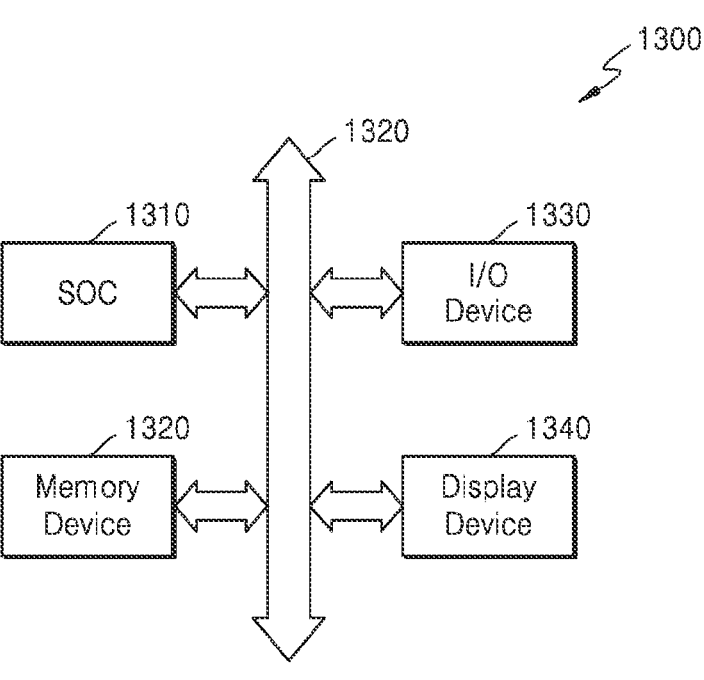
FIG. 10 illustrates a block diagram of an example of a computing system according to embodiments of the inventive concepts.

FIG. 10 illustrates a block diagram of a computing system 1300 according to an exemplary embodiment. Referring to FIG. 10, the computing system 1300 such as a mobile device, a desktop computer, or a server may further include an SOC (system-on-chip) 1310, a memory device 1320, an I/O (input/output) device 1330, and a display device 1340 each of which may be electrically connected to a bus 1350. The SOC 1310 may correspond to the semiconductor device 100 of FIG. 1.

While the inventive concepts have been particularly shown and described with reference to embodiments thereof, it should be understood that various changes in form and detail may be made therein without departing from the spirit and scope of the following claims.

What is claimed is:

1. A semiconductor system comprising:
a semiconductor device comprising a buffer die and first to L-th stack dies stacked on the buffer die and configured to communicate with the buffer die through N through-silicon vias (TSVs), wherein L is an integer greater than or equal to 2, and N is a positive integer; and
a TSV test device comprising:
a test circuit comprising a plurality of metal-oxide semiconductor field-effect transistors (MOSFETs) directly connected to one end or another end of the N TSVs,
a control circuit configured to control a connection between the plurality of MOSFETs and a power supply voltage or a ground voltage, and
a detector circuit comprising a plurality of comparators,
wherein the control circuit is further configured to generate enable signals for testing the N TSVs,
wherein the test circuit is configured to measure each of voltages at the one end and voltages at the another end of the N TSVs according to a clock signal, and
wherein the detector circuit is configured to compare each of the voltages at the one end and the voltages at the another end with a reference voltage, and determine
whether each of the N TSVs has a plurality of TSV defect types according to comparison results,
wherein the TSV test device is further configured to test a first TSV included in the N TSVs for two or more different TSV defect types during one period of the clock signal.

2. The semiconductor system of claim 1, wherein the TSV test device is configured to determine the plurality of TSV defect types comprising:
during any one period of the clock signal, a first TSV defect type indicating that one of both ends of a TSV of the N TSVs is fixed to the power supply voltage, a second TSV defect type indicating that one of the both ends of the TSV is fixed to the ground voltage, a third TSV defect type indicating that a path between the both ends of the TSV is open, a fourth TSV defect type indicating that the path between the both ends of the TSV is resistively open, a fifth TSV defect type indicating that the TSV is electrically connected to another TSV, and a sixth TSV defect type indicating that an insulator between the TSV and a substrate is deteriorated and thus a current flows into the substrate.

3. The semiconductor system of claim 2, wherein the TSV test device is further configured to
measure a voltage at one end of the first TSV when the clock signal is 1, and
determine that the first TSV has a fault due to the first TSV defect type or the fifth TSV defect type when the voltage at the one end of the first TSV is greater than or equal to the reference voltage.

4. The semiconductor system of claim 3, wherein the TSV test device is further configured to
measure the voltage at the one end of the first TSV when the clock signal is 0, and
determine that the first TSV has a fault due to the second TSV defect type, the third TSV defect type, or the fourth TSV defect type when the voltage of the one end of the first TSV is less than the reference voltage.

5. The semiconductor system of claim 4, wherein the N TSVs comprise the first TSV and a second TSV spaced apart from the first TSV by a certain distance or more, the TSV test device is further configured to measure a voltage at another end of the second TSV when the clock signal is 0, and when the voltage at the another end of the second TSV is less than the reference voltage, detect that the second TSV has a fault due to the sixth TSV defect type.

6. The semiconductor system of claim 1, wherein the control circuit comprises a NAND gate, N D-flip-flops, and N XOR gates, and the control circuit is further configured to control the plurality of MOSFETs using the N D-flip-flops such that the test circuit sequentially tests the N TSVs according to the clock signal.

7. The semiconductor system of claim 6, wherein the TSV test device comprises M test circuits connected in parallel, wherein M is greater than or equal to 2, the control circuit and the detector circuit are shared by the M test circuits, and the M test circuits test M TSVs respectively disposed in the M test circuits for two or more different TSV defect types during any one period of the clock signal.

8. The semiconductor system of claim 1, wherein the test circuit comprises a plurality of common MOSFETs and a plurality of common variable resistors commonly connected to the N TSVs, and the N TSVs share the clock signal based on the plurality of common MOSFETs.

9. The semiconductor system of claim 8, wherein, when an internal resistance value of one TSV included in the N TSVs is a target resistance value, a voltage value at the one end and a voltage value at the another end of the N TSVs are respectively set to be half of the power supply voltage by adjusting the plurality of common variable resistors, and the target resistance value is a predetermined resistance value for determining a fault.

10. A semiconductor device comprising:

at least two semiconductor chips electrically connected through at least one through-silicon via (TSV); and a TSV test device arranged on at least one of the at least two semiconductor chips, wherein the TSV test device is configured to measure at least one test voltage provided by voltage division based on a signal output through the at least one TSV, and detect whether the at least one TSV has first to third faults according to the at least one test voltage, wherein the TSV test device comprises a voltage divider comprising an upper common zone, a TSV zone, and a lower common zone, wherein the upper common zone is connected to each of a power supply voltage and an end of the at least one TSV and comprises a zeroth common resistor and a zeroth common P-channel metal oxide semiconductor (PMOS), and wherein the TSV zone comprises the at least one TSV, a first N-type metal-oxide semiconductor (NMOS), and first and second PMOSs each directly connected to the at least one TSV, the lower common zone is connected to each of a ground voltage and another end of the at least one TSV and comprises first and second common resistors, and first and second common NMOSs, and the at least one test voltage is a PIN voltage corresponding to a voltage of a node connected to the zeroth common PMOS and the first NMOS, or a TSV voltage corresponding to a voltage of a node connected to the first and second common NMOSs in parallel and the second PMOS.

11. The semiconductor device of claim 10, wherein the TSV test device is further configured to compare the at least one test voltage with a reference voltage, and test whether the at least one TSV has the first fault corresponding to a bridge defect or a Stuck-at-1 fault; the second fault corresponding to an open defect, a resistive-open defect, or a Stuck-at-0 fault; or the third fault corresponding to a pinhole defect, according to a comparison result.

12. The semiconductor device of claim 11, wherein the TSV test device is further configured to during any one period of a clock signal, test whether the at least one TSV has the first fault when the clock signal is 1, and detect the first fault when the TSV voltage is greater than or equal to the reference voltage.

13. The semiconductor device of claim 12, wherein the at least one TSV comprises a first TSV and a second TSV, and the TSV test device is further configured to during any one period of the clock signal, simultaneously test whether the first TSV has the second fault and test whether the second TSV has the third fault when the clock signal is 0, detect the second fault when the TSV voltage is less than the reference voltage, and detect the third fault when the PIN voltage is less than the reference voltage.

* * * * *